United States Patent [19]
Faulkner et al.

[11] Patent Number: 6,023,209
[45] Date of Patent: Feb. 8, 2000

[54] COPLANAR MICROWAVE CIRCUIT HAVING SUPPRESSION OF UNDESIRED MODES

[75] Inventors: Mark V. Faulkner, Boulder Creek; Edward B. Stoneham, Los Altos; Clifford A. Mohwinkel, San Jose; Mark J. Vaughan, Sunnyvale, all of Calif.

[73] Assignee: Endgate Corporation, Sunnyvale, Calif.

[21] Appl. No.: 08/675,931

[22] Filed: Jul. 5, 1996

[51] Int. Cl.[7] .................................. H01P 3/08; H01P 5/00; H01L 29/40
[52] U.S. Cl. .......................... 333/238; 333/12; 333/247; 257/664; 257/778
[58] Field of Search ...................................... 333/12, 24 R, 333/27, 33, 81 A, 238, 246, 247; 257/778, 664

[56] References Cited

U.S. PATENT DOCUMENTS

| | | | |
|---|---|---|---|
| 3,351,806 | 1/1975 | Sear et al. | 333/238 X |
| 3,863,181 | 1/1975 | Glance et al. | 333/246 X |
| 4,045,750 | 8/1977 | Marshall | 333/100 |
| 4,600,907 | 7/1986 | Greliman et al. | 333/246 |
| 4,614,922 | 9/1986 | Bauman et al. | |
| 5,030,935 | 7/1991 | Williams et al. | 333/246 |
| 5,105,171 | 4/1992 | Wen et al. | 333/116 |
| 5,225,796 | 7/1993 | Williams et al. | 333/12 |
| 5,349,317 | 9/1994 | Notani et al. | 333/236 |
| 5,528,203 | 6/1996 | Mohwinkel et al. | |
| 5,668,512 | 9/1997 | Mohwinkel | 333/247 |
| 5,777,528 | 7/1998 | Schumacher et al. | 333/246 X |

OTHER PUBLICATIONS

Dylan F. Williams, "Damping of the Resonant Modes of a Rectangular Metal Package", *IEEE Transactions on Microwave Theory and Techniques,* vol. 37, No. 1, Jan. 1989, pp. 253–256.

*Primary Examiner*—Robert Pascal
*Assistant Examiner*—Barbara Summons
*Attorney, Agent, or Firm*—Anderson & Adamson, LLP; George M. Steres

[57] ABSTRACT

Two or three conductor coplanar transmission lines and lossy coplanar resistive films are formed on a surface of a substrate. The resistive film dimensions and resistivity are selected to suppress various spurious electromagnetic modes within and around the substrate. The resistive films may be positioned along the outer edges of the transmission lines or between the transmission line conductors. The resistive film may have regular spaced openings for producing an average resistivity different than that of a continuous resistive film. In one embodiment, a signal conductor has a serpentine shape and resistive film elements are positioned between adjacent sections of the signal conductor. In another embodiment, interdigitated resistive film elements extend between transmission line conductors.

69 Claims, 8 Drawing Sheets

COPLANAR MICROWAVE CIRCUIT HAVING SUPPRESSION OF UNDESIRED MODES

BACKGROUND OF THE INVENTION

1. Field of the Invention

The present invention generally is directed to a structure and method of suppressing undesired modes of electrical current propagation, such as cavity, slab, surface wave and microstrip modes, in coplanar conductor transmission lines and circuits. The invention is specifically related to the use of defined coplanar resistive patterns disposed adjacent to the perimeter of strip conductors of coplanar transmission lines and circuits connecting mm wave, flip-chip mounted, active devices.

2. Previous Art

Many applications of coplanar strip transmission line structures are known. Some previous patents dealing with mode suppression are shown below.

| U.S. Pat. No. | Inventor |
|---|---|
| 3,351,816 | Sear et al. |
| 4,045,750 | Marshall |
| 4,600,907 | Greliman et al. |
| 5,105,171 | Wen et al. |
| 5,225,796 | Williams et al. |
| 5,349,317 | Notani at al. |

All of these patents show coplanar strip transmission line structures.

BACKGROUND

Coplanar circuit structures are referred to in the art in several ways. For the purposes of this discussion coplanar circuit structures include coplanar waveguide structures (CPW) and coplanar slotline structures (CSL). Both CPW and CSL are characterized by a conducting sheet, having longitudinal gaps or slots defined between signal carrying conductor edges of the sheet which are adjacent to each other. In theory, the sheet forms ground planes, (for both CPW and CSL) disposed on either side of the slot (or slots), which extend transversely toward infinity from either side of the signal carrying slot or slots.

In practice, due to spurious modes that are set up by these infinite or semi-infinite sheets, it is better that the conducting sheet extends only a finite transverse distance on either side, sufficient to behave essentially as a CPW or CSL. The actual structure for the purposes of this application, then, appears more like parallel strips of conductors separated by gaps. A more precise nomenclature might be coplanar waveguide strip structures and coplanar slot strip structures. Those skilled in the art recognize the equivalence of the theoretical concept and practical expression; therefore in this document the terminology CPW and CSL will be understood to be structures having essentially those characteristics.

A coplanar waveguide structure (CPW) has one or more closely spaced but separated longitudinal coplanar strip signal conductors positioned transversely between and separated from two adjacent longitudinal coplanar ground conductors by respective gap widths. RF signals are carried along the facing edges of the signal to ground conductors. The ground conductors may be much wider than the gaps between signal to signal or signal to ground.

A coplanar slotline structure (CSL) has two closely spaced coplanar longitudinally extending conductors having facing edges having a transverse gap therebetween, that is generally much smaller than the lateral width of the conductors. An RF signal is carried along the facing edges of the conductors.

MICROSTRIP MODES

Coplanar conducting strips on a substrate can develop a microstrip mode in which an undesired potential difference exists along the conductor strip with respect to a spaced away ground plane, where the ground plane can be located on the opposite side of the substrate or spaced above and/or below the substrate and the coplanar strips. This is illustrated with reference to FIGS. 9 and 10. A typical coplanar strip transmission line structure (CPW) 50 consists of a central signal conducting strip 52 spaced apart by gap distance, Dg, between two adjacent coplanar conductors 54. The CPW 50 is used to interconnect millimeter (mm) wave RF circuit components from DC to hundreds of GHz. The circuit components may be amplifiers, oscillators, mixers, tuning and delay elements and the like (not shown).

Discontinuities, and particularly asymmetrical discontinuities, such as stub tuning elements, at any location along the CPW line can initiate coupling of energy from the CPW mode into microstrip mode propagation.

With reference to FIGS. 9 and 10, the conducting strips 52, 54 are defined on one side or top of an insulating substrate 56. The CPW 50 and substrate 56 are typically mounted in a conductive housing 58. Housing 58 provides shielding to reduce radiation or electromagnetic interference effects (EMI). The substrate 56 may be typically mounted with the opposite side, or bottom of the substrate 56 on or near the interior of one surface of the housing 58, or may be suspended between two opposed, interior surfaces.

The housing 58 may thus form a ground plane 60 on the opposite side and above the substrate 56. The thickness of the substrate 56 is generally large enough that the electromagnetic fields associated with propagation of signals of wavelength $\lambda_s$ along the CPW 50 are relatively uninfluenced by the presence of the ground plane 60. Alternatively, the ground plane 60 may be a conductive sheet formed on the side of the substrate 56 opposite the conductors 52, 54, as shown in FIG. 1, and the housing 58 may be made of an insulating material, such as plastic.

Longitudinal electric currents flow in the conductors 52 and 54 as indicated in FIG. 9 and as shown in the plot of lateral sheet current density, Jc, versus lateral distance, x, in FIG. 11. The current density, Jc, associated with the desired CPW modes is a maximum in the conductors 52, 54 near the inner facing edges adjacent to gaps 53 between the conductors 52 and 54. The current density, Jc, falls off rapidly with distance from the inner facing edges of conductors 52–54 due to attraction between highly concentrated opposite polarity charges (indicated by plus and minus signs along the facing edges of conductors 52, 54.)

Undesired microstrip mode (MSM) electric fields represented in FIG. 10 as directed arrows, Ema (electric fields in air) and Ems (electric fields in substrate), can propagate in the dielectric substrate 56 between the CPW 50 and the ground plane 60 or in the air dielectric between the CPW and the housing 58. Undesired cavity modes having electric fields shown as Ew, may also propagate in the housing 58. The current density distribution, Jc', from the undesired MSM currents is indicated by dashed lines in FIG. 11 and is concentrated toward the outer edges of the ground conductors 54 due to like charges along the outer edges of conductors 54 of FIG. 9 repelling each other. MSM return currents flow in the ground plane 60. Undesired slab and dielectric modes also have electric fields, Em, propagating within the substrate 56.

In FIG. 1 of Williams et al, U.S. Pat. No. 5,225,796 ('796) there is shown a lossy resistive sheet 22 in the place of the ground plane 60 as a means to suppress spurious MSM propagating through the substrate 56. This method provides some improvement at the cost of additional processing, i.e., coating the backside of the substrate 56 with nichrome and the like. FIG. 2B of '796 shows a resistive film 28 along the outer edge of a coplanar conductor having a width dimension less than that of the conductor and much less than the wavelength of the signal propagating along the coplanar conductor. The narrow film 28 is not as effective as desired in suppressing either surface modes propagating along the bottom surface of the substrate 26 or MSM waves associated With the metal chuck acting as a ground plane 30 for the assembly 24.

WAVEGUIDE AND CAVITY MODES

However, other spurious modes are not attenuated by the backside lossy sheet. For example, waveguide and cavity modes may also exist in the volume of the housing 58 on either or both the conductor side or substrate side of the CPW 50 circuit pattern. Electric field lines of cavity or waveguide modes (WGM) are indicated in FIG. 10 by the dashed lines, Ew.

Waveguide or cavity mode suppression may be achieved by restricting the width and/or height, Wa and Hw of the housing 58. This ensures the waveguide is below cutoff for signals of wavelength $\lambda_f$ greater than 2Wa or 2Hw. However, higher- and lower-order modes may still not be suppressed sufficiently for high frequency operation, especially in the frequency range above 20 GHz. Also, in the range of 40 GHz or higher, the minimum required size of the waveguide or cavity 58 becomes so small (on the order of about 0.15 inches or 3.8 mm) that it may be difficult to incorporate all the desired circuitry. It also becomes more expensive to control the dimensions of the waveguide 58 as machining tolerances become a significant fraction of the waveguide dimensions, Hw and Wa.

Both MSM and WGM may also exist on bias connections between power supply points and active components in the CPW circuits. Any coplanar strips used to connect DC power from one point on the circuit to another separated point may have a structure which will support undesired modes. Coplanar strips providing DC power connections may also support CPW modes in circuit areas which are not intended for signal propagation.

Up to now, undesired mode suppression often requires bonding of wires, tabs or loops from one part of the circuit to another. Discrete components may be added at particular points to try to absorb or minimize unwanted modes. Spurious mode suppression using such methods requires additional parts and additional labor for assembly of high frequency coplanar circuits.

It would be an advantage to provide a method for suppressing MSM, WGM and undesired CPW spurious modes over a wide frequency range.

It would also be an advantage to provide a method for suppressing modes while also reducing the parts count.

With reference to FIG. 12, there is shown, schematically, a perspective view of an exemplary prior art CPW circuit structure 100. The structure 100 includes a series of active, mm wave components A1, A2, A3, connected by CPW transmission line segments T1, T2, T3 feeding one port of a mixer, X1. A second set of series components A4, A5 are connected by CPW transmission line segments T4, T5 to another port of the mixer, X1. The inputs to X1 are mixed down and fed to a final IF amplifier A6 through CPW segment T6.

The structure 100 is enclosed in a housing 102 composed of three sections 104, 106, 108, each section having a relatively long, narrow aspect along the respective CPW circuit segment. Each section has a lateral width dimension, Wa1, transverse to the CPW circuit direction and a vertical height in elevation, Hw1. These dimensions must closely follow the CPW circuit topology and must be tightly controlled to suppress spurious waveguide or cavity modes. The constraints of closely following the circuit topology and tight control adds additional cost and complexity to the manufacture of CPW circuits.

The relatively long and narrow aspect ratios of the sections 104, 106, 108 give the structure 100 relatively less structural strength than would otherwise be possible with a more square aspect ratio. Additional structural support is therefore required to make the assembly 102 strong and robust. It would be an advantage to provide a mode suppression method and structure which would allow the manufacturer to relax the dimensions Wa1 and Hw1 for reduced cost and improved manufacturing flexibility.

SUMMARY OF THE INVENTION

It is an object of the invention to provide a structure and method for attenuating and suppressing spurious microstrip modes in CPW and/or CSL circuits connecting to mm-wave active devices.

It is another object of the invention to provide a structure and method for attenuating and suppressing spurious waveguide or cavity modes in CPW and/or CSL circuits connecting to mm-wave active devices.

It is another object of the invention to provide a structure and method for attenuating and suppressing spurious modes in bias structures of CPW and/or CSL circuits connecting to mm-wave active devices.

It is yet another object of the invention to provide a structure and method for simultaneously attenuating and suppressing spurious microstrip, slab, waveguide and cavity modes in CPW and/or CSL circuits connecting to mm-wave active devices over a wide band of frequencies with minimal addition of process and manufacturing steps.

It is also an advantage provided by this invention, to relax the constraints of size and shape of the waveguide or cavity enclosing a CPW and/or CSL circuit connecting to mm-wave active devices to reduce the cost and increase the robustness of the overall assembly.

The desirable normal mode of functioning of coplanar circuits connecting to active devices is with the separate and spaced apart adjacent conductor strips having differing electrical potential associated with conduction of electrical current along and between them.

The microstrip mode of functioning is prevented by loading the side or outermost strips (which are typically ground reference conductors or strips extending along the length of the conductor). This provides a resistive electrical path coupled to the microstrip mode electromagnetic fields.

In one aspect of the invention, a coplanar circuit structure is generally provided for suppressing spurious modes comprising a transmission line including at least first and second spaced-apart coplanar conductors mounted on a substrate surface, the first and second conductors being spaced apart by a first gap. A resistive film is disposed on the substrate surface and extending coplanar with and along a length of the first conductor in the first gap. The resistive film is coupled to the first conductor for attenuating spurious modes.

In another aspect of the invention, a coplanar circuit structure is provided for suppressing spurious modes which comprises a transmission line including at least first and second spaced-apart coplanar conductors mounted on the substrate surface, the first and second conductors being spaced apart by a first gap. A first resistive film extends coplanar with and along a length of the first conductor, and a second resistive film extends coplanar with and along a length of the second conductor. The first and second resistive films are coupled to the first and second conductors for attenuating spurious modes.

A CSL embodiment of the present coplanar spurious mode attenuating and suppressing circuit structure invention includes an insulating substrate having a planar surface upon which is defined a first coplanar conductor. The first conductor has a signal conducting edge defining a signal propagation direction. A second coplanar conductor is also defined on the planar surface. The second conductor has a second signal conducting edge facing the first conductor signal edge. The first edge and second edge are spaced apart by a gap, generally, although not necessarily of uniform width. For example, the gap may be tapered.

The first and second coplanar conductors have respective third edges outwardly disposed from the first and second signal conducting edges. The respective third edges are spaced away from the related first and second signal conducting edges. The spacing of the respective signal edges and the corresponding third edges is such that signals of wavelength $\lambda_s$ can propagate along the gap between the first edge and the second edge with essentially zero current component along the third edges.

A first and second coplanar resistive film of a predetermined sheet resistance is defined on the planar surface. The resistive films have a respective fourth edge coupled to the corresponding third edge of the first and second conductors. The resistive films also have respective distal fifth edges spaced away from the corresponding fourth edges. The resistive films have a width between the fourth and fifth edges sufficient such that signals propagating in undesired modes along the signal propagation direction are attenuated and suppressed through the electromagnetic field of the first and second coplanar conductors to the respective fourth edges of the resistive films.

The coplanar mode suppression resistive structures of this invention are particularly suited for signal interconnections and bias connections to flip-chip mounted active components operating in the mm-wave region.

In an alternative embodiment of the present invention, a spurious mode suppressing circuit structure as summarized above is defined with the spacing of the respective fifth edges from the corresponding fourth edges such that spurious microstrip mode current components tending to flow conductively in and near the fifth edges of the resistive films and standing wave voltage components will be attenuated by the resistive films. The spurious microstrip mode signals associated with such current components will be suppressed by the coupling to the respective resistive films.

In another embodiment of the present invention of a coplanar spurious mode suppressing circuit structure, the spacing of the respective fifth edges from the corresponding fourth edges is such that spurious waveguide or cavity mode signals in a waveguide or cavity volume above the CPW structure are attenuated by the resistive film.

In yet another embodiment of the present invention the resistive files have a width between the fourth and fifth edges sufficient such that undesired coplanar signals of wavelength, $\lambda_x$, sufficiently longer than a predetermined value and propagating along the signal propagation direction are attenuated by the current components conductively coupled through the first and second coplanar conductors to the respective fourth edges of the resistive films.

The resistive film may be defined having an average sheet resistivity of between about 10 ohms/square and about 1000 ohms/square. A resistive film having a sheet resistance about equal to the characteristic impedance of an undesired incident wave will be effective in attenuating or absorbing such a wave. For example, in otherwise unused areas of the substrate, and in specific areas of the substrate enclosing active devices, the effective sheet resistivity may be about 50 ohms/square.

Other values of sheet resistivity may be selected to attenuate other modes having different characteristic impedance. The sheet resistivity may be varied along the film to provide attenuation of different modes at different locations.

The resistive film may also be defined as a sheet having a plurality of apertures therein. The apertures may be arranged in a regular array, e.g., forming a mesh of resistive material. The mesh may be formed with a periodically repetitive pattern. The patterned mesh may have a predetermined ratio of open, insulating area to covered, resistive area, $R_{oc}$. Through appropriate patterning of a resistive film as a mesh, the resistive film having low intrinsic resistivity can be made to effectively function as a sheet of higher average resistivity for wavelengths of a dimension greater than several multiples of the pattern period. This provides a method for varying the average sheet resistance at different points on the circuit, without changing the intrinsic sheet resistance of the resistive film.

The apertures may also be arranged in an aperiodic, irregular, or semi-random arrangement, as desired, to present different average sheet resistance in different areas. An aperiodic, semi-random pattern could be used to attenuate undesired modes having a broad range of characteristic impedances over a wide frequency range.

An appropriate effective sheet resistance of the resistive film on the surface of the circuit results in strong absorption of energy from waveguide, slab or cavity modes that are incident on the resistive mesh. The mesh structure therefore can attenuate and suppress both microstrip and waveguide or cavity modes.

The insulating-to-resistive-area-ratio of the mesh may be made different at various locations along the substrate. The area ratios may be selected to present a different average sheet resistance at different locations on the substrate for attenuating and suppressing different spurious modes at the varied locations.

The mesh may be defined with a pattern of openings in a rectangular grid, or an array of circular holes or the like, where the openings are sufficiently smaller than the wavelength of the spurious signal to be suppressed.

The width of the resistive film between the fourth edge and the fifth edge is generally more than about $\frac{1}{4}\lambda_x$, where $\lambda_x$ is the wavelength of the spurious signals to be suppressed.

Very-low-frequency modes are also suppressed by configuring the resistive film with additional large areas, each of which is defined herein as a "sea of resistor", (SOR). This provides an effective lossy structure enclosing the circuit patterns of interest but not significantly coupled to the desired signals propagating along the CPW transmission paths.

BRIEF DESCRIPTION OF THE DRAWINGS

For a further understanding of the objects and advantages of the present invention, reference should be had to the following detailed description, taken in conjunction with the accompanying drawings, in which like parts are given like reference numerals and wherein.

DETAILED DESCRIPTION OF EMBODIMENTS OF THE INVENTION

Figure 1:
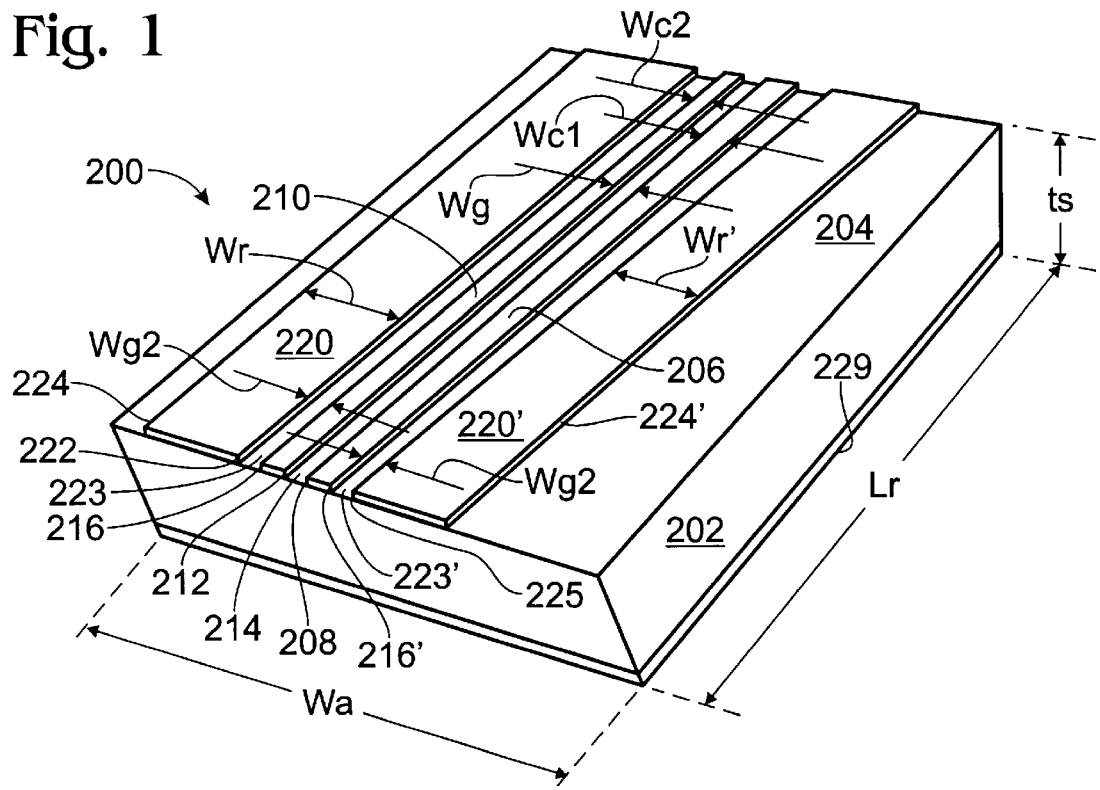
FIG. 1 illustrates an embodiment of a CSL structure including two mode suppression resistive films for connection to flip-chip active devices in accordance with this invention.

With reference to FIG. 1, there is shown a first embodiment of a coplanar spurious mode attenuation and suppression structure 200 in accordance with the present invention. The structure 200 is shown as a coplanar slotline structure.

The structure 200 includes an insulating substrate 202, having a thickness ts made from a low loss dielectric such as glass-cloth teflon, silicon, alumina, beryllia, aluminum nitride, quartz, glass and semi-insulating GaAs, or the like. The substrate 202 has a planar surface 204 opposite from backside layer 229 and upon which is defined a longitudinally extending first conductor 206. The conductor 206 defines a first signal conducting edge 208. A second conductor 210 is disposed on the surface 204, coplanar with the conductor 206. The conductor 210 defines a second signal conducting edge 212 spaced away from the first conducting edge 208 by a first gap 214 having a width Wg.

At least one of the conductors 206, 210 are connected to a terminal of a flip-chip active device (not shown) mounted on the substrate surface 204. Interconnection of the coplanar spurious mode suppression structures of this invention with flip-chip active devices is described below.

The conductors 206 and 210 extend transversely in opposite directions away from the gap 214. The conductor 210 defines a third conductor edge 216 spaced away from the second conductor edge 212 by a distance Wc2.

A first resistive film 220 is disposed on the surface 204 coplanar with the conductors 206 and 210. The coplanar resistive film 220 defines a first resistive edge 222 parallel to and spaced away from the third conductor edge 216. The film 220 defines a third resistive edge 224 spaced at a distance Wr away from the first resistive edge 222.

The width Wc1 and the spacing Wg are selected to allow coplanar mm-wave signals of wavelength $\lambda_s$ at a signal frequency $f_s$ to propagate along the inner facing conductor edges 208 and 212. For wide band transmission of signals at mm-wavelengths, for example, $f_s$, between about 20 and 40 GHz, Wc1 will be on the order of magnitude of about 0.125 mm (0.005 inches) and Wg will be on the order of magnitude of about 0.025 mm (0.001 inches).

The degree of attenuation of undesired modes depends on the specific dimensions and dielectric constant of the substrate 202, the wavelength of the undesired modes and the length, Lr, of the longitudinal conductors 206, 210 and the coupled resistive film 220 and width, Wr, of the resistive strip 220. For effective attenuation and suppression of unwanted MSM of wavelength, $\lambda_x$, in accordance with the present invention, the width, Wr, of the resistive film 220 is selected to be about $\lambda_x/4$ or about 1.125 mm (0.045 inches) or greater over a length, Lr of about one wavelength, or about 4.5 mm (0.18 inches) or greater at a frequency of about 40 GHz.

It is contemplated that as the width, Wr, of the resistive films is reduced, the length, Lr, of the longitudinal conductors 206, 210 and coupled resistive films 220, 220' must increase to achieve the desired attenuation of spurious modes. The relationship between Wr and Lr for a given attenuation depends on the type of coplanar transmission line, the type and thickness of substrate material, the type of spurious mode, the film sheet resistance and the wavelength of the mode.

The resistive film edge 222 and the conductor edge 216 may be spaced apart by second gap 223 having width Wg2. The resistive film edge 222 and the conductor edge 216 are sufficiently close to be electromagnetically coupled, or may be in coincident contact, being conductively coupled.

Also shown on FIG. 1, is an alternate configuration for the mode suppression structure 200. The coplanar conductor 206 includes a fourth conductor edge 216' spaced away from the first conductor edge 208 by a distance Wc1. A second coplanar resistive film 220' is disposed adjacent to the conductor 206. The second film 220' defines a second resistive edge 225 parallel to and spaced away from the conducting edge 216' by a third gap 223' having width Wg2. The second film 220' defines a fourth resistive film edge 224' parallel to and spaced away from the second resistive film edge 225 by the distance Wr'.

The two conductors 206, 210 may be made transversely symmetrical about the edges 208, 212 by selecting the widths Wc1 and Wc2 to be equal. The two resistive films 220, 220' may be symmetrically disposed about the coplanar conductors 206, 210 minimizing the initiation of undesired propagation modes.

The edges 224, 224' of the resistive films 220, 220', may be disposed laterally away from the conductors 206, 210, by a distance sufficiently great, such that the films 220, 220' cover any unused portion (not shown) of the substrate surface 204, thereby providing a broad area of resistive film (SOR) for absorbing undesired modes; e.g., slab, cavity, waveguide, microstrip, and the like.

In preferred embodiments of this invention, a flip-chip active device (not shown) having at least two terminals may be mounted on the substrate 204. One or more of the device terminals (not shown) may be connected to at least one of the first or second signal conductors 206, 210. A more detailed description of an active device embodiment of the present invention is presented below.

Figure 2:
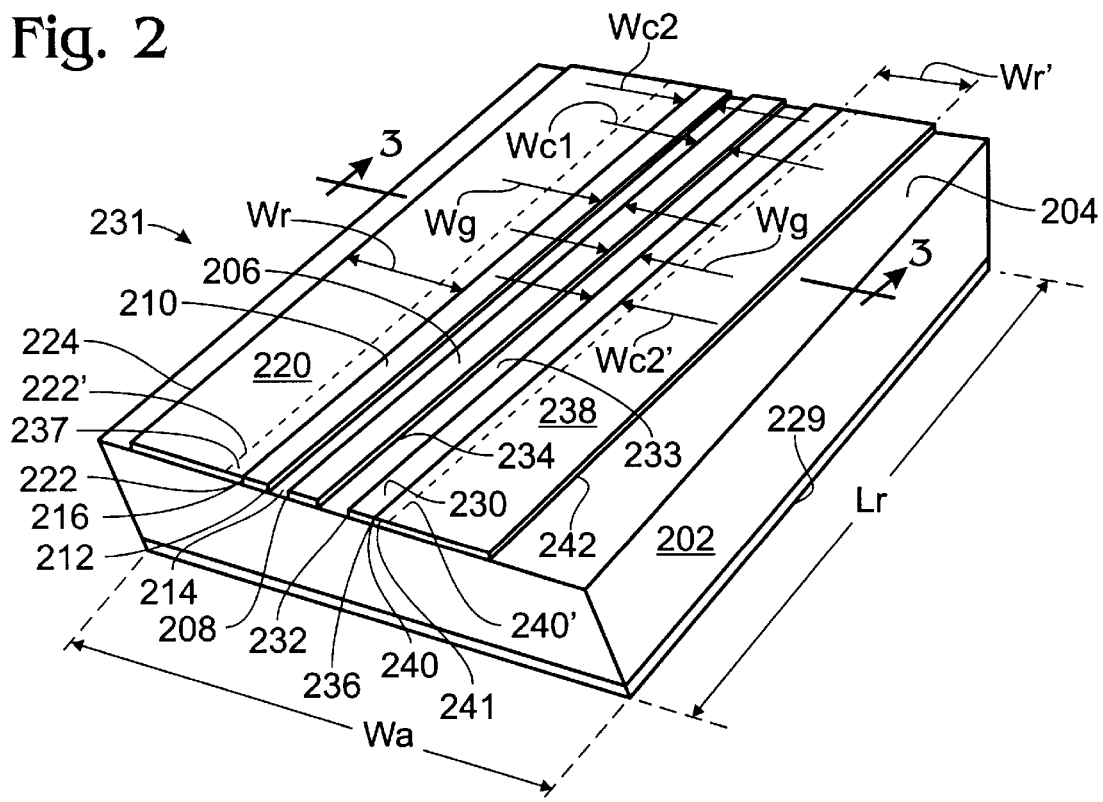
FIG. 2 depicts an embodiment of a CPW structure including to mode suppression resistive films for connection to flip-chip active devices in accordance with this invention.

With regard to FIG. 2, there is shown an alternate CPW spurious mode attenuation and suppression structure 231 in accordance with the present invention. The CPW structure 231 is connected with a flip-chip mounted device (not shown) in accordance with the present invention. The structure 231 includes elements having the same function as, and numbered the same as, elements in FIG. 1, with additional elements herein described. A third conductor 230 is defined on the surface 204 of the substrate 202 coplanar with the conductors 206 and 210. The conductor 230 has one inner edge 232 spaced away from and facing another edge 234 of the first coplanar conductor 206, forming a gap 233. The edges 232 and 234 form coplanar edges for propagating RF signals of wavelength $\lambda_s$ along with edges 208, 212 as part of CPW or coupled slotline wave guide 231.

The conductor 230 has an outer edge 236 spaced a distance Wc2' away from inner edge 232 to form another part of a coplanar waveguide structure associated with conductor 210, gap 214 and conductor 206. A second lossy resistive film 238 has a first edge 240 conductively coincident with the outer edge 236 of conductor 230. An outer edge 242 of the film 238 is spaced away from first edge 240 by a distance Wr'.

Structure 231 is found to be effective in attenuating spurious MSM propagation over the desired frequency band without significantly attenuating the desired CPW mode signals. For alternative CPW mode suppression transmission lines having a longitudinal dimension of many wavelengths, the width, Wr, may be significantly less than $\frac{1}{4}\lambda_x$ and still be effective. It is anticipated that a mode suppression transmission line in accordance with this invention will require a greater length along the signal conductors 206 and 210 for a given amount of attenuation, as the width, Wr, is decreased.

With reference to FIG. 2, films 220, 238 may each be a "sea of resistor", implying that the resistive films may extend over large areas of the substrate 204 not otherwise covered with circuit patterns. Covering extensive areas of the substrate 204 with the extension of the resistive films 220, 238 further enhances attenuation and suppression of spurious modes and comes at no additional cost in the process of manufacturing the coated and patterned substrate 204. This is particularly true for manufacturing processes which already utilize coplanar resistive films to define discrete or distributed resistors, for example, as terminations, attenuators, bias elements or the like.

With regard again to FIG. 2, in other embodiments of the invention, the edges 222 and 240 of the resistive films do not have to be coincident with the respective conductor edges 216 and 236, but instead may be spaced apart (not shown). This is indicated by alternative edges 222' and 240' (shown as dashed lines) of the resistive film 220 and 238 spaced apart from the conductive edges 216 and 236 by gaps 237 and 241 such that the resistive films 220 and 238 are conductively separated but electromagnetically coupled to conductors 210 and 230. The separation of edges 216, 222' and 236, 240' creates additional fields within the gaps 237 and 241 which may couple additional energy from undesired spurious modes into the resistive films 220, 238.

SUPPRESSION OF MSM WAVES

Figure 3:
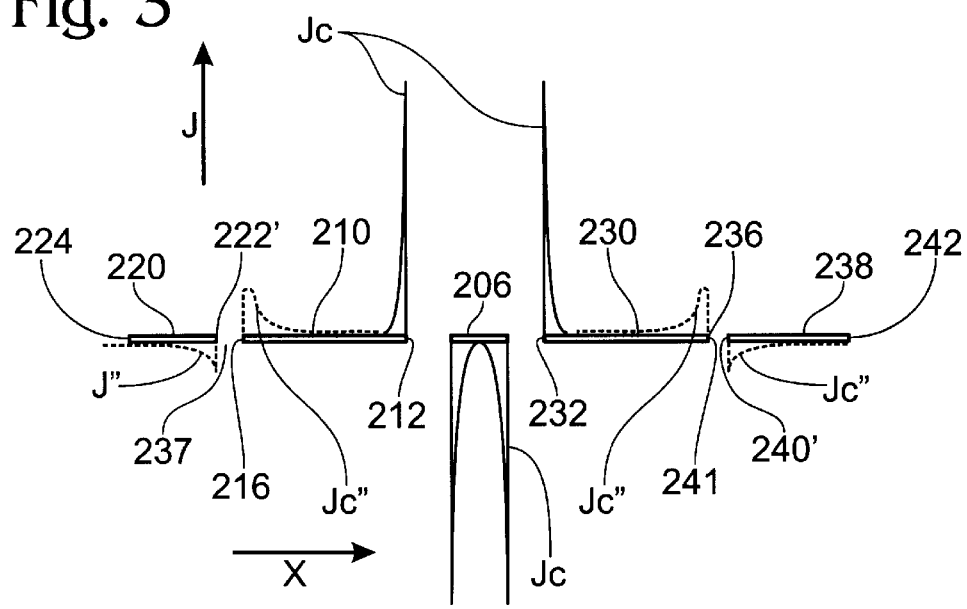
FIG. 3 is a graph of current density vs distance taken along the line 3—3 of FIG. 2.
Figure 11:
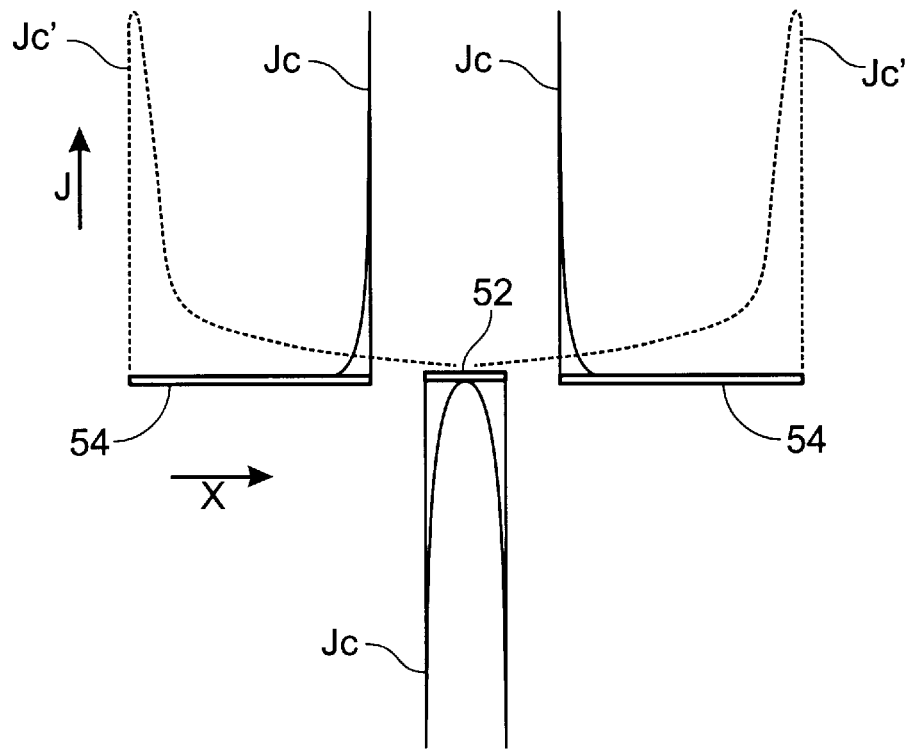
FIG. 11 is a graph of current density for the prior art CPW structure of FIG. 9.
Figure 12:
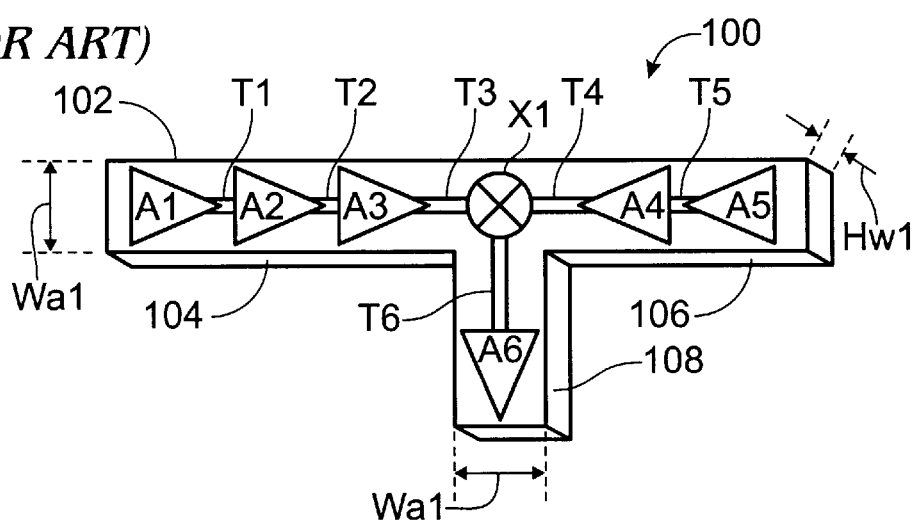
FIG. 12 is schematic perspective view of a prior art CPW structure enclosed in a waveguide or housing.

Referring to FIG. 3 in comparison with FIG. 11, there is shown the current distribution, Jc and Jc", (taken along the line 3—3 of the coplanar mode suppression resistive structure 231 shown in FIG. 2) compared with the current distribution for the prior art CPW structures. The maximum of the current density, Jc", of MSM at the outer edges of the conductor strips 210 and 230 is attenuated (compared to the magnitude of Jc' in FIG. 11) by the influence of the current density, Jc", in the facing edges of the resistive strips 220 and 238 without appreciably affecting the current distribution, Jc, of the CPW mode in the center conductor strip 206 and the inner edges 212 and 232 of the strips 210 and 230.

In a preferred embodiment of this invention, the resistive films 220 and 238 may be separated from the respective adjacent conductor edges 216 and 236 by respective gaps 237 and 241. The width of gaps 237 and 241 are typically as small as possible for a given substrate fabrication process. The gaps 237 and 241 may provide additional attenuation of the spurious mode due to MSM surface currents at the edges 222, 240.

Figure 4:
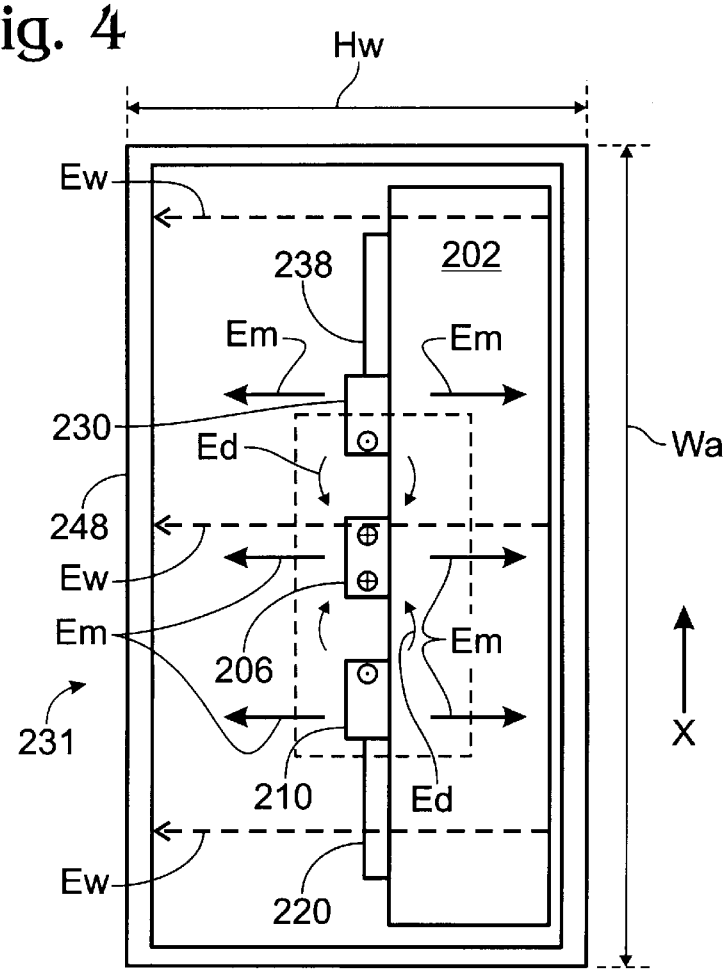
FIG. 4 is a cross sectional elevation view of the coplanar mode suppression structure of FIG. 2 in accordance with this invention taken along the line 3—3 and enclosed in a waveguide or cavity housing.

Wr and Wr' are selected to provide significant loading to the MSM electromagnetic fields which would otherwise propagate along the substrate 202. With reference to FIG. 4, there is shown an elevation view of a cross section of coplanar transmission line 231 of FIG. 2 taken along the line 3—3, in which the transmission line 231 is disposed within a cavity housing 248. The effectiveness of significant loading to the MSM electromagnetic fields can be seen with the aid of the directed arrows, Em. The arrows, Em, represent the electric field distribution of undesired MSM that are supported by the CPW conductors 206, 210 and 230 as a whole. Undesired MSM have a component of electric field, Em, which is tangential (not shown) to the substrate surface.

Returning again to FIG. 2, the resistive films 220 and 238 of sufficient width (Wr and Wr') attenuate currents associated with MSM waves which are flowing at or near the coincident edges 216, 222 and 236, 240. Also, components of electric field tangential to the films 220, 238 will be attenuated. Longer wavelength MSM waves will be even more effectively attenuated by the films 220 and 238 shown in FIG. 2, if the width Wr and Wr' are on the order of $\frac{1}{4}\lambda_x$ or larger, where $\lambda_x$ is the wavelength of the spurious mode of concern. Larger dimensions of Wr and Wr' are increasingly effective for lower frequencies.

In the limit as Wr and Wr' become very large, attenuation of MSM waves is effective to very low frequencies, well away from the bandwidth of interest. Also as Wr and Wr' become large, the films 220, 238 appear as discrete resistors for very low frequencies and can be conveniently connected to circuit ground points (not shown) in locations which do not affect the RF signals propagating along the CPW lines 206, 210, 230.

In FIG. 4, upper and lower oppositely directed arrows Em represent electric field vectors of the MSM. Higher order modes, such as slab modes, will be even more effectively suppressed since their wavelengths are even shorter than those of the fundamental mode associated with the overall dimension Wa and the widths, Wr, Wr' of the resistive films are a greater multiple of $\lambda_x/4$, the spurious mode quarter-wavelength.

SUPPRESSION OF WAVEGUIDE OR CAVITY MODES

With reference to FIG. 4, there is shown an embodiment of waveguide or cavity mode suppression of coplanar microwave circuits in accordance with the present invention. The CPW transmission line 231 is enclosed in a conductive housing 248 having a height Hw and a width Wa. The housing 248 is thus a waveguide or cavity and can support undesired electromagnetic waveguide or cavity mode waves above cutoff, e.g. $\lambda x<2Wa$. The dashed arrows, Ew, represent electric fields of waveguide or cavity modes in the housing 248. In the present invention, the resistive films 220 and 238 intercept the electric or magnetic field lines of the waveguide or cavity modes, thereby suppressing and attenuating them. The widths, Wr, Wr' of the films 220 and 238 are selected to be greater than a minimum value for suppressing undesired waveguide, slab or cavity modes. A resistive film 220, 238 having a width, Wr, Wr', greater than or equal to about $\lambda_x/4$, provides sufficient attenuation per unit length of waveguide or cavity modes to effectively suppress such modes from propagating within the waveguide or cavity 248.

Referring again to FIG. 2, although not shown, the edges 236 and 240 may alternatively be overlapped, with an insulating layer therebetween, to achieve conductive isolation, but with electromagnetic coupling between the conductor 230 and film 238.

In general, the attenuation per unit length of the resistive film structure (SOR) of this invention will depend on the mode and wavelength of the signal to be suppressed, the sheet resistance of the resistive film, the width of the film and the particular configuration of the facing edges of the resistive film and the corresponding adjacent coplanar conductive strip. The total attenuation to achieve the required suppression of unwanted modes in a specific circuit will depend on the gain of the active elements included in the circuit and the layout of the circuit.

Figure 5:
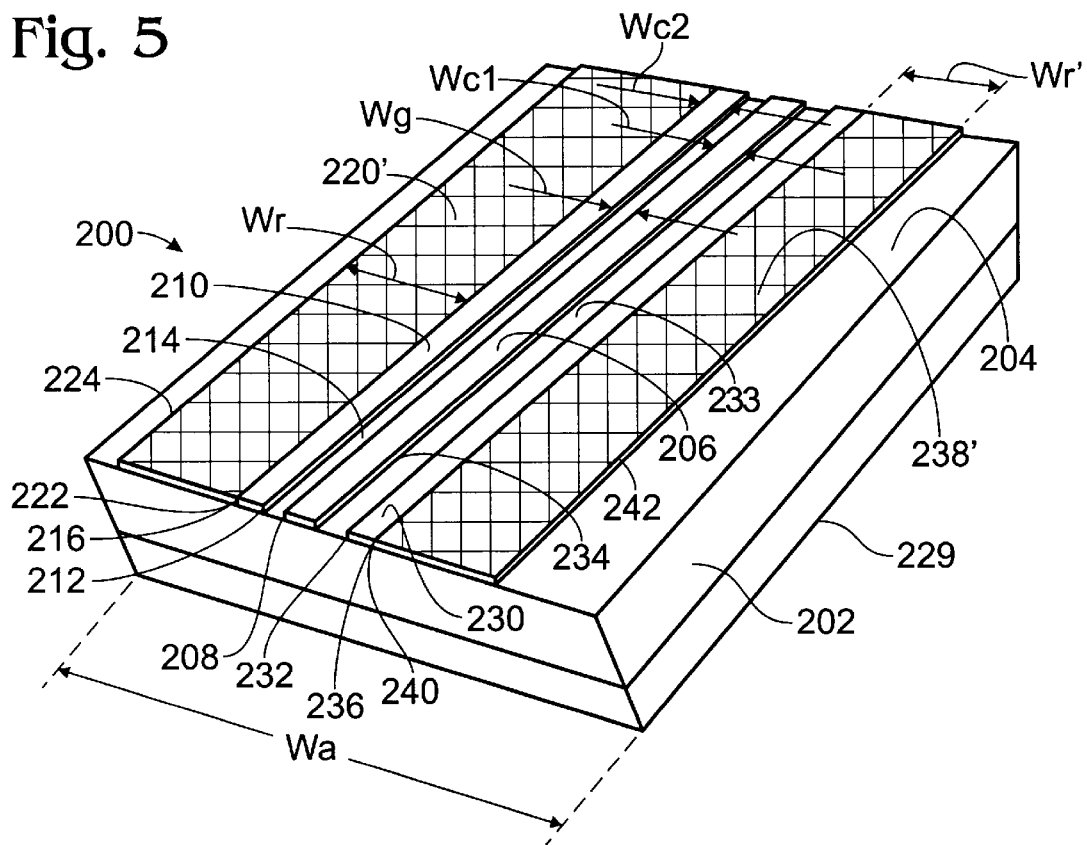
FIG. 5 is a perspective view of a mode suppression CPW structure having a resistive film formed into a mesh in accordance with another aspect of this invention.

With reference to FIG. 5, there is shown an alternative embodiment of the present invention for waveguide or cavity mode suppression extended from that of FIG. 2. In FIG. 5 the same elements are numbered with the same reference numerals as in FIG. 2. The CPW mode suppression structure of FIG. 5 is provided with coplanar resistive films 220' and 238' in which films 220' and 238' take the place of films 220 and 238 in FIG. 2. The films 220' and 238' are not a solid sheet of uniform resistivity, as before shown in FIG. 2.

Figure 6:
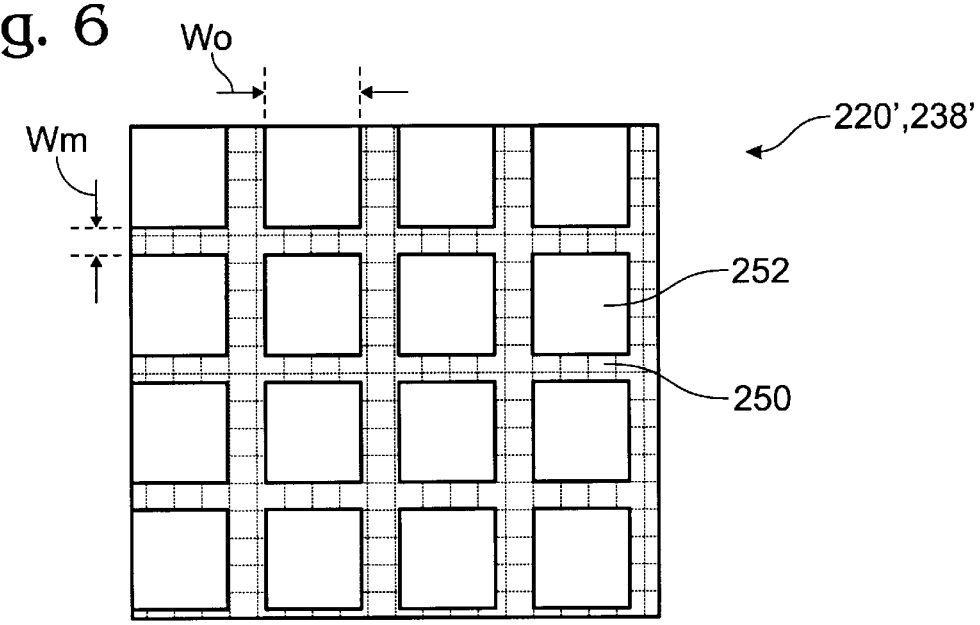
FIG. 6 is a plan view of an exemplary mesh construction for one embodiment of the present invention.

With reference to FIGS. 5 and 6 the films 220' and 238' are patterned to form a mesh or lattice work 250 formed from a resistive film having intrinsic sheet resistivity, Rs. The patterned mesh 250 may have a predetermined ratio of open, insulating area to covered, resistive area, $R_{oc}$. The resistive films 220' and 238' may also be defined as a sheet having a plurality of apertures 252 therein. The apertures 252 may be arranged in a regular array, e.g., forming the mesh 250 of resistive material.

With appropriate patterning of a resistive film as a periodic mesh, the resistive film having low intrinsic resistivity can effectively function as a sheet of higher average resistivity for nodes having wavelengths of dimension greater than several multiples of the pattern period. This provides a method for varying the average sheet resistance at different points on the circuit, without changing the intrinsic sheet resistance of the resistive film.

The mesh 250 is characterized by a lateral dimension Wm, forming essentially zero conductivity apertures 252 of dimension Wo. The dimensions Wo and Wm of the lattice work 250 and the openings 252 are selected such that the average sheet resistivity, Ravg, of the films 220' and 238' over several multiples of the repetitive pattern period, Wm+Wo, is higher than the intrinsic sheet resistance, Rs, of the material 250. The mesh 250 may be formed by etching a continuous sheet through an etch resist, by punching or by an overlay of crossing resistive strips as is well known.

Typically, the resist mesh 250 would be etched from a deposited film, such as nichrome, tantalum nitride or the like deposited on the substrate surface 204. The mesh 250 may be formed from a resistive sheet having the open apertures 252, to form a grid, or formed by holes spaced at suitable intervals etched or punched in a sheet bonded to the substrate.

A preferred intrinsic sheet resistance, Rs, for a deposited resistive film 250 is about 50 ohms/square. Films 220' and 238' can be patterned with the ratio of the area of the apertures 252 to the area of the mesh 250 to yield a higher average sheet resistance to provide a dose match to the characteristic impedance of waveguide or cavity modes that are incident on the film 250. The mesh configuration of a resistive film in accordance with this invention is effective in suppressing both spurious microstrip, waveguide, slab and/or cavity modes.

The apertures 252 may also be arranged in an aperiodic, irregular, or semi-random arrangement (not shown), as desired, to present different average sheet resistances in different areas. An aperiodic, semi-random pattern could be used to attenuate a range of undesired modes having a range of characteristic impedances over a broad range of frequencies.

In areas that require an average sheet resistance lower than the intrinsic sheet resistance of the resistor material, the mesh can be formed by overlaying the intrinsic sheet with a conductor pattern, in which the former apertures 252 are replaced with conductor material, and the stripes 250 are made of a resistive film. The relative size of the apertures, Wo, and the stripes, Wm, are adjusted to achieve the desired average sheet resistance.

Figures 7, 8:
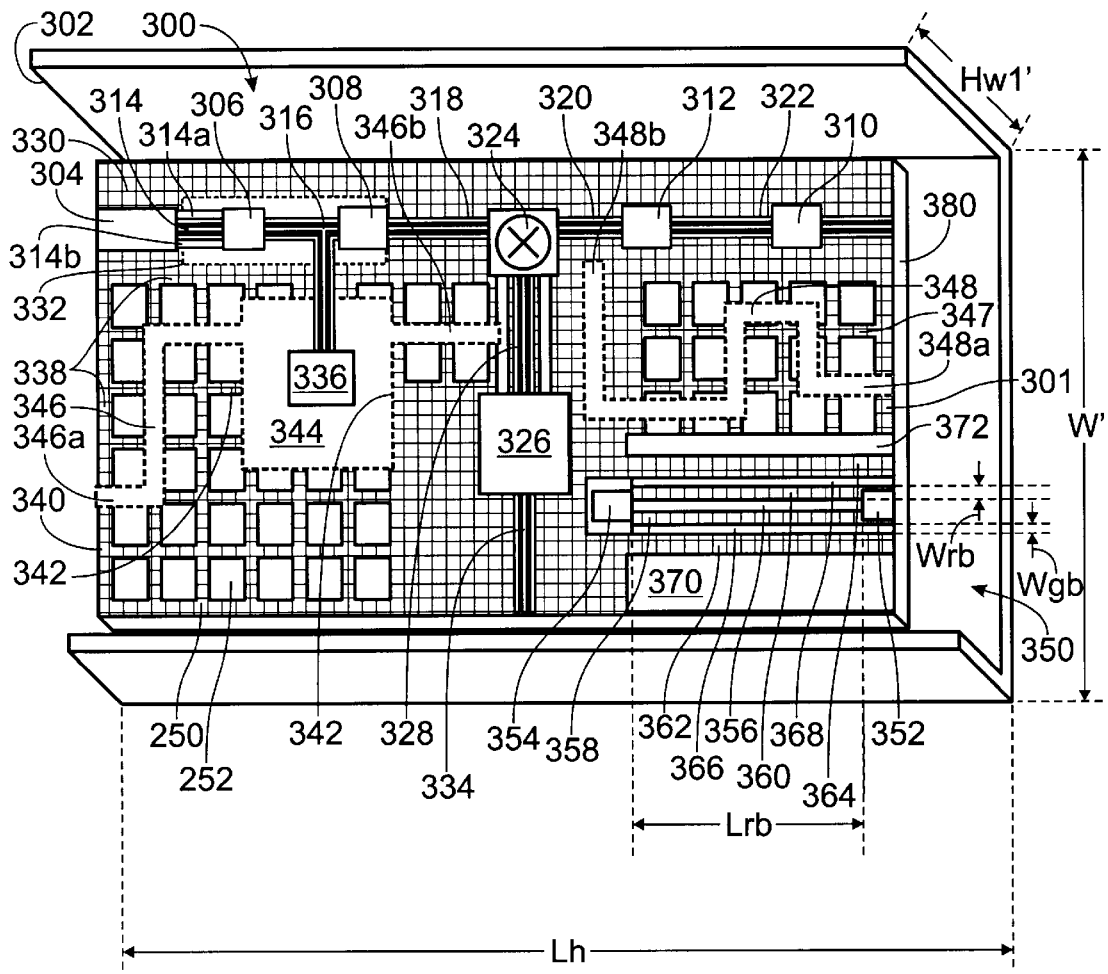
FIG. 7 illustrates a perspective view of a CPW circuit structure having resistive mode suppression films connected to flip-chip active devices in accordance with this invention.
FIG. 8 is a detailed plan view of an inset portion of FIG. 7.
Figure 9:
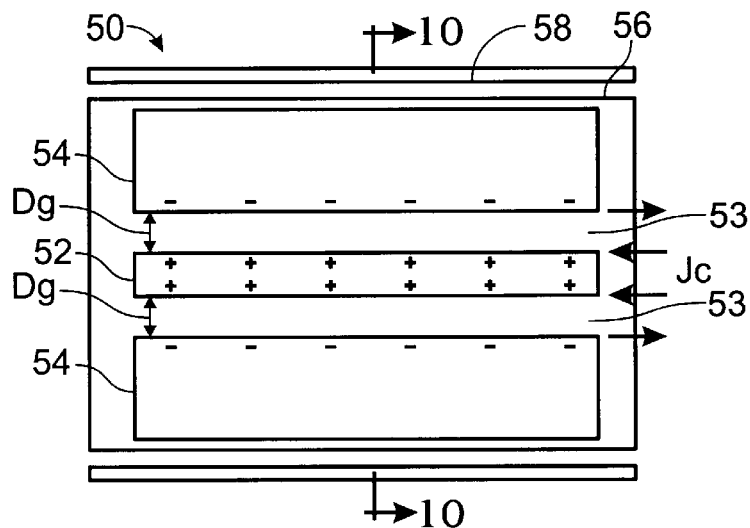
FIG. 9 is a plan view of a prior art CPW structure.
Figure 10:
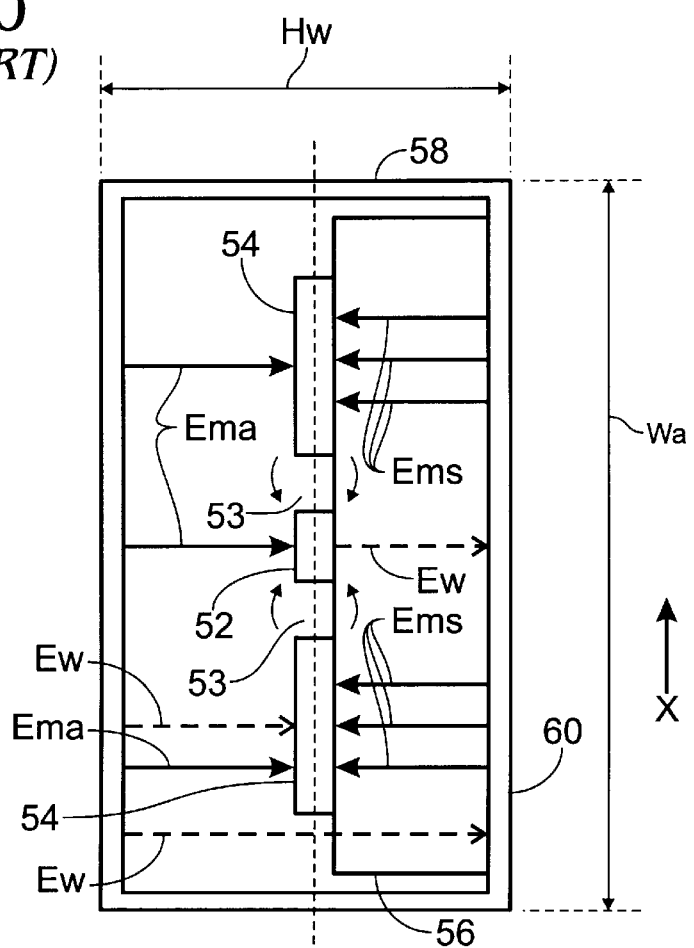
FIG. 10 is a cross sectional view of the prior art structure of FIG. 9 taken along the line 10—10.

With reference to FIG. 7, there is shown a partially cut away perspective view of an exemplary embodiment 300 of several CPW spurious mode suppression circuit structures in accordance with this invention. The structure 300 is mounted on an insulating planar substrate surface 301 disposed in a housing 302. The structure 300 includes a sequential series of flip-chip mounted, mm-wave, active components 304, 306, 308, mounted on the substrate planar surface 301. The active component structures 304, 306, 308, may include flip-chip amplifiers, oscillators, filters and the like. Each of the components has one or more flip-chip mounted input connections and one or more flip-chip mounted output connections. The components 304, 306, and 308 may also include multi-component sub-assemblies of hybrid or integrated circuit type.

The component structures 304, 306, 308, are connected in series from respective flip-chip mounted output connections to respective flip-chip mounted input connections (not shown) by opposed ends of respective mode suppression CPW transmission line segments 314, 316, 318. The mode suppression CPW transmission line segments 314, 316, 318 are defined on the substrate 301 in accordance with the present invention. The CPW transmission line segments 314, 316, 318 are constructed according to the mode suppression principles discussed above with reference to FIGS. 1–6.

With reference to FIG. 8, a magnified view of a flip-chip mounted active device 306 inset in FIG. 7 is shown connected between longitudinal signal input CPW transmission line 314 and longitudinal output CPW transmission line 316. Input CPW transmission line 314 includes segment 314e centered between parallel ground strips 314c and 314d. Output CPW line 316 includes signal segment 316a centered between coplanar ground strips 316c and 316d.

Coplanar ground strips 314c and 314d are spaced apart from outer edges of conductor 314e by insulating gaps of width Wg. Ground strips 314c and 314d are spaced apart from and electromagnetically coupled to laterally opposed coplanar resistive films 330 and 332. The films 330 and 332 define respective resistive film edges 330a, and 332a, spaced apart from respective outer edges of ground conductors 314c and 314d by gaps 314a and 314b of width Wg2. Undesired spurious modes along the conductors 314e, 314c and 314d are suppressed by the coupling between the ground strips 314c, 314d and the adjacent resistive films 330, 332.

The resistive film edges 330a and 332a extend proximally along the conductors 314c and 314d. The resistive film edges 330a and 332a are offset laterally inward proximal to the input 306a to form edges 330b and 332b conductively coupled with respective outer edges of coplanar ground conductor strips 316c and 316d. Resistive film edge 330b extends conductively coincident with an outer edge of conductor edge 316c to the next device 308. Resistive film edge 332b' extends conductively coincident with an outer edge of conductor 316d' to the next device 308.

Resistive film edge 332b extends conductively coincident with the conductor edge 316d to a T-junction formed by ground conductors 316c, 316d and signal conductor 316a with ground conductor 316d' and signal conductor 316a'. Conductors 316c, 316a and 316a are the output of device 306. Conductors 316c, 316a, and 316d' are the input of device 308. Conductors 316d, 316a' and 316d' are the CPW connection to the element 336 (of FIG. 7). The element 336 may be a tuning element or a bias input element as described below.

Undesired spurious modes along the conductors 316a, c, d, a' and d' are suppressed by the conductive coupling between ground conductors 316c, d, d' and the respective resistive film edges 330b, 332b, b'.

The flip-chip 306 has input flip-chip bump 306a mounted on the input line 314e, output flip-chip bump 306b mounted to output line 316a and laterally opposed common ground, flip-chip bumps 306c and 306d mounted to joined ends of the respective ground strips 314c, 316c and 314d, 316d.

A coplanar ground conductor 317 disposed between the input 306a and output 306b connects the joined ends of 314c, 316c to the joined ends of conductors 314d, 316d.

The CPW segment 318 feeds one input port of a mixer 324. A second set of series components 310, 312 mounted on the substrate are connected by opposed ends of CPW transmission line segments 320, 322 respectively, defined on the substrate 301, to another input port of the mixer 324. The CPW transmission line segments 320, 322 are defined on the substrate 301 in accordance with the present invention. The mixer 324 inputs from segments 318 and 320 are mixed and fed from the mixer 324, to an amplifier 326 through mode suppression CPW segment 328. The amplifier 326 is connected to an output (not shown) through a final mode suppression CPW coplanar transmission line structure 334.

Passive bias and matching circuitry elements (not shown) may also be connected to the CPW segments 314–318 with similar mode suppression topologies.

Coplanar resistive films 330 and 332 are laterally disposed on opposite sides of the CPW transmission line segments 314, 316, 318, 320, 322. The films 330, 332 extend laterally outward on the substrate 301 to a width sufficient to suppress microstrip modes and waveguide or cavity modes otherwise present in the structure 300. The coplanar resistive films 330 and 332 may extend transversely to form SOR absorbing films extending over otherwise unused portions of substrate 301.

The structure 300 may be enclosed in a simple rectangular housing 302 characterized by a lateral width dimension, W, a length dimension, Lh, and a height dimension, Hw1'. The dimensions Lh, W and Hw1' of the housing 302, and the substrate 301 contained therein, are not restricted to be tightly controlled to suppress microstrip and waveguide or cavity modes. The simple rectangular geometry of the substrate 301 and housing 302 is less expensive and more robust than previous art substrates and housings which must closely follow the CPW circuit topology and which must be tightly controlled to suppress spurious waveguide or cavity modes.

Different areas of the circuit structure 300 may have differing SOR structures depending on the desired mode suppression structure. As described above, the resistive films 330 and 332 adjacent to the CPW segment 314, may be spaced apart from the opposed sides of the segment 314 by a respective parallel gap 314a and 314b therebetween. In contrast, the films 330 and 332 adjacent to the CPW segments 316, 318, 320 and 322 are contiguous with the respective opposed sides of the respective segments and have a lateral width, Wr, sufficient to attenuate the undesired modes.

The gaps 314a and 314b have a width, Wg2, adjusted to provide the desired degree of electromagnetic coupling between the films 330, 332 and the conductive segments 314c, d. At a frequency range of about 20 to 40 GHz, the gap width, Wg2, may be from about 0.025 mm to about 0.05 mm (1–2 mils) and may extend along the segments for many wavelengths.

The element 336 is surrounded by coplanar resistive film or mesh 338 and 340, defining an edge 342. The film 338 is an extension of the film 332.

In an instance where lower loss is desired, the edge 342 is spaced laterally away from the element 336 by an insulating aperture 344 defined in the mesh 338, 340. The edge 342 is spaced sufficiently far from the element 336 to prevent appreciably attenuating the desired signal by the mesh 338.

The material of the mesh films 338, 340 has intrinsic sheet resistivity the same as the material of the films 330, 332, but may be patterned at a process step to provide a mesh composed of stripes 250 and apertures 252 (shown in FIG. 6). The mesh films 338, 340 may be defined as before with stripe 250 width and aperture 252 dimensions to present the desired average sheet resistance in the mesh areas, suitable for attenuating undesired waveguide or cavity, slab and surface wave modes. Different stripe 250 width and aperture 252 dimensions may be selected to provide different average sheet resistances in different circuit areas by merely incorporating the different patterns in the same patterning process step.

Embodiments of this invention incorporating circuits with CSL connections can also be constructed. With reference to FIGS. 7 and 8, a CSL structure may be constructed by omitting a portion of the ground conductor 314d between active device 304 and device 306, omitting the ground conductor 316c between the device 306 and device 308 and repositioning the resistive film edges 330a, b and 332a, b. In a CSL embodiment of the present invention, the resistive film edges 330a and 332a are repositioned such that they are spaced equally away from the respective outer edges of 314c and 314e.

The resistive film edges 330b and 332b are repositioned such that they are essentially contiguous with the respective outer edges of conductors 316a and 316d. In this case, the input to device 306 is connected to a CSL consisting of facing edges of conductors 314e and 314c. The output of device 306 is connected to a CSL consisting of facing edges of conductors 316a and 316d. The repositioned resistive film edges 330a, b and 332a, b suppress unwanted spurious modes by coupling to respective outer edges of conductors 314c, 316e and 316a, 316d.

Continuous coplanar resistive films extending between an input and an output of active devices, may introduce undesired coupling between the input and output. An additional spurious mode suppressing feature of the combined active device, coplanar resistive film connections of this invention is achieved with resistive film decoupling slots. One example of the resistive film decoupling slot aspect of the present invention is shown with regard to device 326 and components 304, 306 and 308 of FIG. 7.

The films 338 and 340 may be formed to define a decoupling slot 346 interposed between the device 326 and the components 304, 306, and 308. The slot 346 is configured to provide an insulating electrical discontinuity or gap between the films 338 and 340 along the surface 301. The configuration of the electrical discontinuity of the slot 346 is arranged to essentially inhibit or suppress transmission or communication of undesired spurious signals through the resistive films 338 and 340 between the respective output of device 326 and the respective inputs of components 304, 306, and 308.

The mesh films 338 and 340 may be completely separated by the de-coupling slot or aperture 346 extending between two opposed open ends 346a and 346b. The end 346a is disposed on one side of the two devices 306 and 326. The opposite end 346b is disposed on the other side of the two devices 306 and 326. The decoupling slot 346 between the resistive mesh films 338, 340 provides additional suppression for undesired signals which might otherwise couple from the output of amplifier 326 through the films 338, 340 into an input of one of the components 304, 306 and 308. The slot 346 may be configured as a rectilinear aperture, a semi-circular arc segment, a meandering, or serpentine aperture of uniform or tapering width or an irregular aperture as desired.

The film 347 defines an additional decoupling slot 348 therein having a length between an open end 348a and a closed end 348b. The decoupling slot 348 is interposed between the inputs of component 310, 312 and the output of amplifier 326. The position and length of the slot 348 in the film 347 is adapted such that undesired signal modes in the film 347 are essentially decoupled between the inputs of components 310, 312 and the output of amplifier 326. The open end 348a terminates at one edge of the film 347 at one side of components 310, 312 and 326. The closed end 348b terminates within the resistive film 347 near an opposed side of the group of components 310, 312 and 326.

The shape, size and location of a resistive film decoupling slot for a specific circuit topology may be determined empirically, i.e., by scratching, scoring, cutting, grinding, grooving, or otherwise abrading an aperture in the film of an actual circuit. Alternatively, simulations may be performed to determine the extent to which a decoupling slot is required for suppressing unwanted coupling from one portion of the circuit to another.

Additional decoupling slots may be interposed at different locations on the mode suppression films. Another coplanar mode suppression resistive film 347 is disposed on the substrate 301 between the components 310, 312 and the amplifier 326. The film 347 suppresses propagation of undesired modes along CPW transmission lines 320 and 322.

The decoupling slots 346, 348 may be formed by standard patterning and etching processes or may be formed by abrading, cutting, scratching or otherwise removing a portion of the respective films 338, 340, 347.

Another mode suppression structure in accordance with this invention is also shown with regard to FIG. 7. A lossy bias CPW resistive film mode suppression structure 350 is disposed on the substrate 301. The lossy bias structure 350 includes a longitudinal bias conductor stripe 356 having opposed sides and opposed ends formed on the substrate 301. Two bonding pads 352, 354 are connected at respective end of bias conductor stripe 356. At least one connection 352, 354 is configured for connection to a flip-chip active device (e.g., device 326) by a wire bond or coplanar connection (not shown). The other connection is configured for connection to an external power supply.

On opposed sides of the conductor strip 356 there are no laterally opposed, longitudinally extending coplanar resistive film strips 358 and 360 parallel to and contiguously adjoining the respective sides of the conductor stripe 356. The resistive strips 358 and 360 extend generally parallel to and longitudinally along the conductor strip 356 for a distance, Lrb, and extend laterally away from the conductor stripe for a distance, Wrb.

A second pair of laterally opposed resistive strips 362, 364 having predetermined length and width and opposed inner and outer edges are disposed on the substrate 301. The inner of resistive strips 362, 364 edges are parallel to and spaced away from the resistive strips 358, 360 by respective insulating gaps 366, 368 having a width, Wgb. Two laterally opposed ground conductors 370, 372, are connected to the respective opposed outer edges of the second resistive strips 362, 364.

Bias, such as a DC voltage, may be connected (not shown) to pad 352, for connection by wire bonds or other means from pad 354 to one or more of the components of the circuit 300. The bias conductor 356 provides a low DC resistance for efficient transfer of DC or low frequency power from an external supply (not shown) to the circuit components while absorbing or attenuating the transmission of high frequency signals between the ends 352, 354 of the conductor strip 356. The length, Lrb and widths, Wrb, Wgb, of the respective conductor strip 356, resistive strips 358–364 and gaps 366, 368 are selected to provide the desired attenuation of mm-wave signals travelling from one portion of the coplanar circuit to another.

Additional series and shunt elements, such as chokes and filter capacitors (not shown) may be added as is well known by those skilled in the art, for additional filtering. The advantage of the lossy bias structure 350 is that it is easily formed from the processes used to construct the other CPW components and resistive mode attenuation structures of this invention.

The bias conductor strip 356 and adjacent resistive strips 358, 360 may be formed into coplanar configurations other than that of a simple straight line having a uniform cross-section. The conductor strip 356 may be tapered, uniformly or logarithmically, or may be segmented into multiple rectilinear sub-sections joined end to end having the resistive strips 358, 360 suitably aligned alongside. The strip 356 may also be formed as a longitudinal conductor having one of number of shapes; e.g. a monotonically increasing linear taper, a logarithmic or exponential taper. The strip 356 may also be curvilinear, e.g., a coplanar uniform width spiral or tapered spiral or the like, connected to or coupled with a plurality of adjacent resistive coplanar film elements.

In a monolithic semiconductor integrated circuit embodiment of the present invention, having the same surface topology as shown in FIG. 7, it is contemplated that the planar surface 301 is the surface of a monolithic bulk semiconductor 380, such as GaAs, having the active (and/or passive) devices 304, 306, 308, 324, 312, 310, 326 defined therein by integrated circuit techniques; e.g., film deposition, photolithographic definition, implantation, and diffusion process steps. The conductors 314c, d, e and 316a, c, d, and the resistive films 330, 332 are defined and connected to the active devices at a process step included in the integrated circuit fabrication process.

Other insulating and semi-insulating substrates may be used in alternative embodiments of the present invention. Materials such as semi-insulating GaAs, indium phosphide, high resistivity silicon, diamond and silicon carbide are contemplated as substrates for flip-chip embodiments of this invention. These same materials are also contemplated as suitable for monolithic integrated circuit embodiments having the active devices configured therein.

Figure 13:
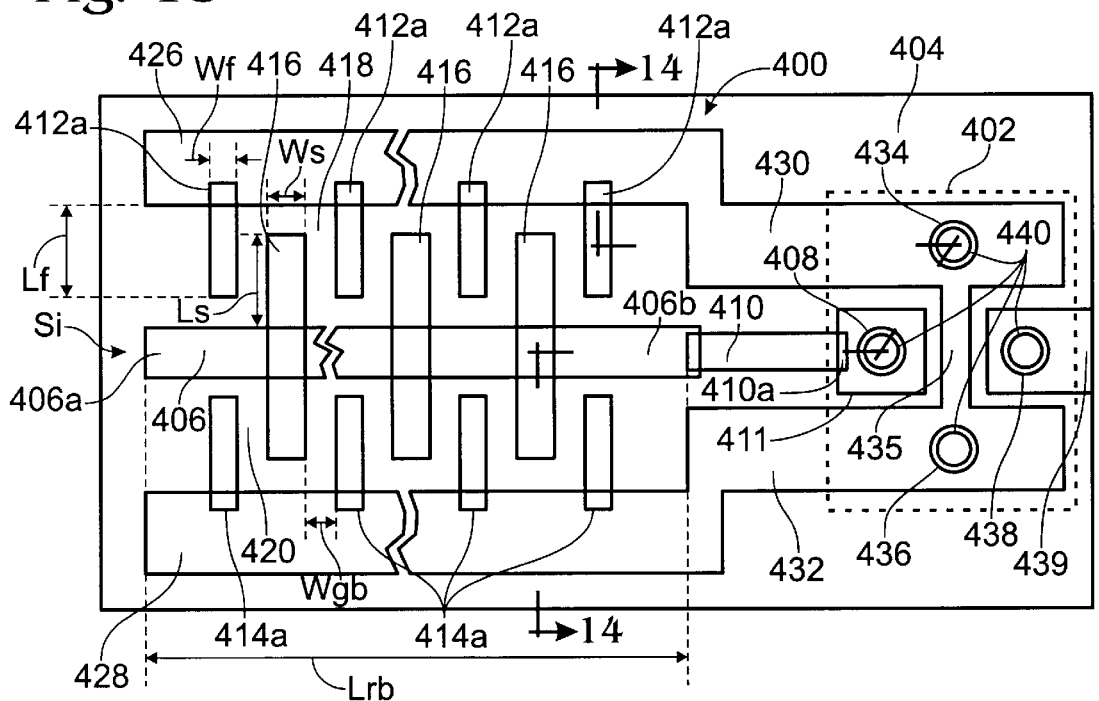
FIG. 13 is a schematic of a plan view of a lossy line, signal absorbing CPW structure in accordance with this invention.

With regard to FIG. 13, there is shown an interdigitated resistive coplanar mode suppression structure 400 in accordance with this invention connected to a coplanar flip-chip mounted active device 402. The coplanar, interdigitated resistor, mode suppression structure 400 and the flip-chip 402 are mounted on an insulating substrate surface 404. The structure 400 is configured to connect a low frequency signal or slowly varying bias, Si, from an input device (not shown) along a low resistance conductor strip 406 from one end 406a to a second end 406b. The conductor strip 406 may be a signal or bias input, for example, used to activate a mm-wave component. The second end 406b is connected to an input 408 of the flip-chip 402 through a component 410 and connection 410a. The component 410 may be a coplanar resistor formed as part of the resistive structure herein described, or may be a lumped component such as a flip-chip resistor. The connection 410a may be a coplanar connection, a wire bond, or the like connected to a coplanar pattern 411 for receiving the flip-chip bump 440 connection to input 408.

The signal conductor 406 is configured as a longitudinal strip extending for a length, Lrb, between the two ends 406a and 406b. Disposed on either side of the strip 406 are first and second opposed coplanar resistive structures 412 and 414 having a respective plurality of spaced apart, coplanar comb-like resistive film fingers 412a and 414a. The resistive film fingers 412a and 414a each have an inward facing end proximal to the respective opposed sides of the conductor strip 406. The other end of each of the respective resistive film fingers 412a and 414a are distally disposed, outward facing from the respective sides of the strip 406.

A first and second plurality of coplanar resistive strips 416 are disposed crossing the conductor strip 406. The resistive strips 416 have opposed distal ends projecting orthogonally away from either side of the strip 406. The second resistive strips 416 are arranged such that each strip 416 has one distal end disposed between and partially interdigitated with a pair of inward facing, adjacent resistive film fingers 412a. The other distal end of each strip 416 is disposed between and partially interdigitated with a corresponding pair of oppositely aligned, inward facing, adjacent resistive film fingers 414a. The strips 416 and the fingers 412a and 414a are spaced apart by a width, Wgb, forming respective insulating meandering gaps, 418, 420 therebetween.

A pair of coplanar conductive ground strips 426, 428 are positioned on the substrate 404 distally adjacent to and electrically coupled with respective opposite distal ends of resistive film fingers 412a and 414a. The strips 426 and 428 are preferably conductively connected with the distal ends of strips 412a and 414a, but may be alternatively spaced apart and electromagnetically coupled.

One end of the coplanar ground strips 426, 428 is located adjacent to device 402. Coplanar electrical connections 430, 432 are provided between adjacent ends of coplanar conductors 426, 428 and respective flip-chip ground terminals 434, 436 of the device 402. A coplanar common ground strap 435 positioned between input and output terminals 408, 438 connects the common ground terminals 434, 436. A coplanar output connection 439 connects output terminal 438 to an output structure (not shown).

The resistive film fingers 412a, 414a, and the strips 416 are separated by gaps 418, 420. Fingers 412a and strips 416 may therefore also be described as being disposed on longitudinally disposed lengths of conductors 426 and 406. The signal or bias conductor 406 and the ground conductors 426, 428 in combination with the resistive strips 414, 412 and 416, form a lossy transmission line effective in attenuating mm-wave signals propagating along the conductor strip 406 without significantly attenuating DC power, or sufficiently low frequency signals, conducted along the conductor strip 406.

The resistive strips 416 and resistive film fingers 412a, 414a are dimensioned with respective lengths, Ls, Lf, and widths Ws, Wf, to achieve a desired attenuation at a specific frequency. The attenuation of the typical coplanar attenuation structure 400 in accordance with this invention having a resistive film of about 50 ohm/square resistivity is shown in the accompanying Table I with the referenced dimensions.

The data of Table I was obtained from a structure 400 having gold conductors and 50 ohms per square resistive film, mounted on a BeO substrate about 0.63 mm (25 mils) thick. For comparison, a straight line resistive structure 350 of the form shown in FIG. 7 of the same length and comparable width and spacing dimensions is less effective for the same circuit area.

TABLE I

Ls = 8 mil, Lf = 7 mil, Wgb = 1 mil, Ws = Wf = 1 mil, Lrb = 260 mil

| Frequency, GHz | Loss, S21 dB FIG. 7 | Loss, S21 dB FIG. 13 |
|---|---|---|
| 10 | 2 | 8 |
| 20 | 6 | 22 |
| 30 | 12 | >39 |
| 40 | 19 | >38 |
| 50 | 28 | >38 |

Alternatively, the resistor structure 400 and the flip-chip 402 could be on separate substrates, instead of a single substrate 404. Lossy CPW mode suppression structures 400 may be used as input lines on microprobe structures for probing high frequency devices. The connections 410, 430, 432 from the structure 400 to the device 408 may be made by removably connecting probes, with connections 410, 430 and 432 provided by probes instead of coplanar conductors on the same substrate. The structure 400 could also be used to provide DC power or bias voltage to an active device in a mm-wave coplanar circuit.

Figure 14:
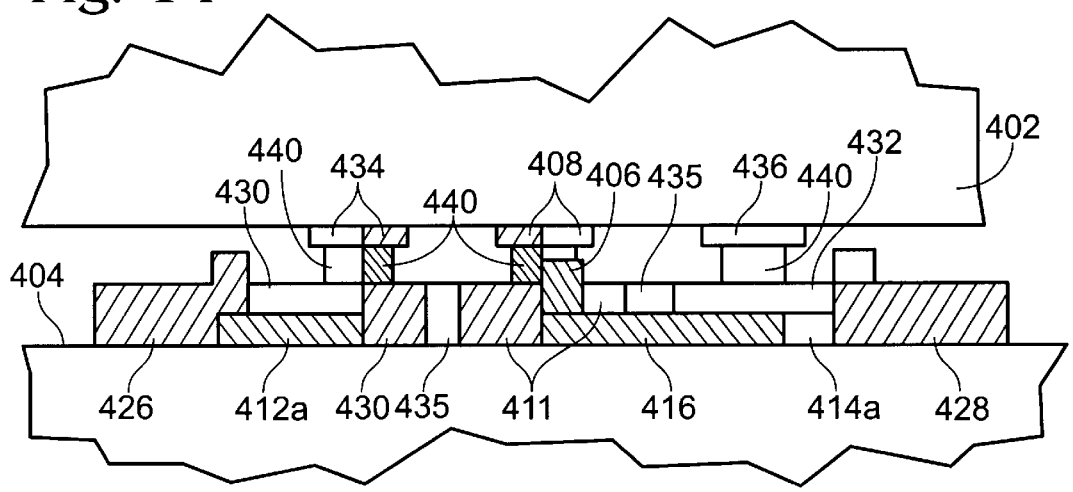
FIG. 14 is a cross section of the structure of FIG. 13 taken along the line 14—14.

With regard to FIG. 14, a cross section of a preferred coplanar configuration of the mode suppression structure 400 in combination with a flip-chip active device is shown taken along the line 14—14 of FIG. 13. The conductors 426, 428, terminals 408, 434, 436, and resistive strips 412a, 414a, 416 are formed as coplanar elements along the surface 404. The flip-chip mounting of the active device 402 is shown by flip-chip bumps 440 connecting between the respective conductive patterns (not shown) on the device 402 and the terminals 408, 434, 436.

Figure 15:
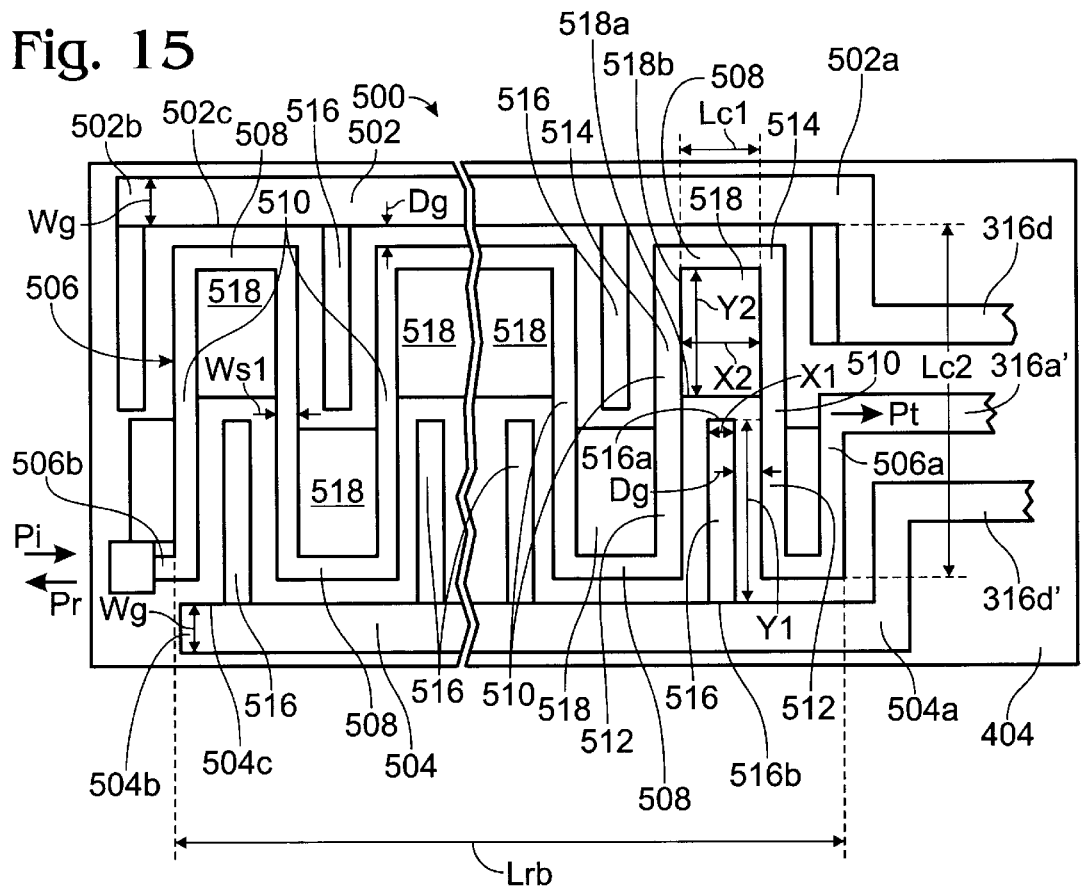
FIG. 15 is a plan view of an alternative signal absorbing structure in accordance with this invention.
Figure 16:
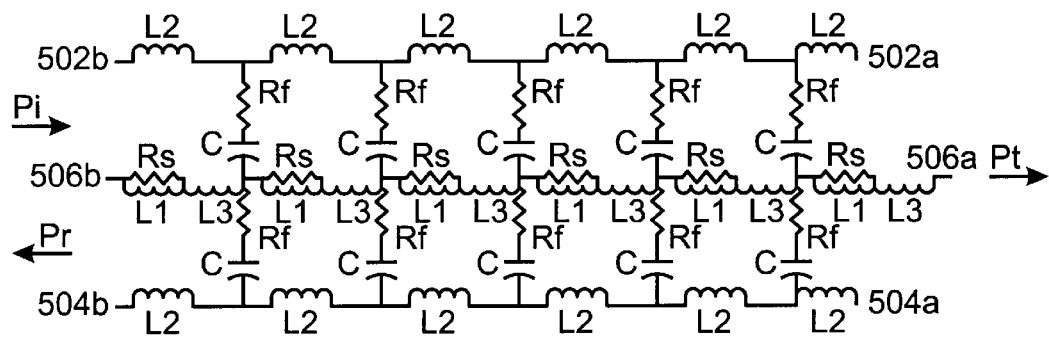
FIG. 16 is an equivalent circuit schematic of the signal absorbing structure shown in FIG. 15.

With respect to FIGS. 15 and 16 there is illustrated an alternative lossy bias resistor structure 500, for supplying bias to mm-wave circuits while absorbing spurious mm-wave signals in accordance with this invention. FIG. 16 is a schematic equivalent circuit of the signal absorbing resistor structure 500.

Two longitudinally disposed, coplanar ground conductor strips 502 and 504 of width, Wg, are defined on the substrate 404. The strips 502 and 504 are parallel to and spaced apart from each other, with opposed proximal and distal ends 502a, b and 504a, b and inward facing edges 502c and 504c. One end of each strip 502a, 504a, is connected to the respective device ground conductors 316d and 316d' (also shown in FIG. 8). The other ends 502a, 504b, extend distally away from the ground conductors 316d and 316d'.

A coplanar signal conductor strip indicated generally by the numeral 506 is defined on the substrate 404 between the inside edges 502c and 504c. The signal strip 506 is configured as a meandering slow wave transmission line composed of a continuously connected succession of coplanar conductive segments. The strip 506 includes a first plurality of longitudinal conductive segments 508, and second plurality of lateral conductive segments 510. Each of the segments 508 and 510 are of equal width, Ws1 between opposed sides. The signal strip 506 extends a distance, Lrb, between the proximal end 506a connected to the coplanar signal conductor 316a' and a distal end 506b located near the ground conductor distal ends 502b, 504b. The proximal and distal ends 506a and 506b are located sufficiently near the respective proximal and distal ends of the two ground conductors to present a suitable impedance and transmission characteristic for the coplanar line 506 as is well understood in the art. The combination of each pair of adjacent lateral segments 510 and the adjoining longitudinal segment 508 is referred to as forming a U-shaped loop open laterally toward an associated ground conductor strip 502 or 504.

The second plurality of lateral segments 510 are each of equal length, Lc2, between first ends and laterally opposed second ends and are positioned orthogonally between the ground conductors 502, 504. The first ends and opposed ends of segments 510 are spaced away from the respective inner edges 502c, 504c of the respective ground conductors 502, 504 by a gap spacing, Dg.

A first one of the segments 510 is located proximally to the proximal strip end 506a. A second one of the segments 510 is displaced distally from the first one of the segments 510 by the length, Lc1, of the segments 508. Each successive segment 510 is displaced distally from the previous segment 510 by the length, Lc1, of the segments 508, forming alternate pairs of equally spaced segments 510 with respective adjacent first ends and opposed ends.

The first plurality of longitudinal segments 508 are each of equal length, Lc1, between respective proximal and distal ends and are oriented parallel to the ground conductors 502, 504. A first one of the longitudinal segments 508 is disposed between the first and second lateral segment 510. The first one of the longitudinal segments 508 has the proximal end joined with the first end of the first lateral segment 510 and the distal end joined with the adjacent first end of the second lateral segment 510. A second one of the longitudinal segments 508 has the proximal end joined with the opposed end of the second lateral segment 510 and the distal end joined with the adjacent opposed end of the third lateral segment 510.

Each succeeding longitudinal segment 508 has the proximal end joined with the lateral end of the preceding lateral segment which is opposite to the lateral end joined to the distal end of the preceding longitudinal segment. The distal end of the succeeding longitudinal segment 508 is joined with the lateral adjacent end of the succeeding lateral segment 510. Each succeeding longitudinal segment is thus adjacent to opposite conductor ground strips 502, 504. Each longitudinal segment 508 has an outer edge spaced away from the corresponding ground strip by the gap distance, Dg.

Mm-wave signals introduced at the distal end 506b are absorbed along the structure 500 toward the proximal end 506a by attenuation from the coplanar resistive films coupled with the signal line 506, as described below. Conversely, mm-wave signals from the conductor 316a' will be absorbed along the line 506 toward the distal end 506b. This prevents coupling of RF signals into or from the power supply and subsequently from or into other active circuits on the common substrate 404.

A first plurality of coplanar lateral resistor strips 516 is defined on the substrate 404. Each resistor strip 516 has a lateral length, Y1, between an inward facing end 516a and an opposed outward facing end 516b, the length being orthogonal to the ground conductors 502, 504. Each lateral resistor strip 516 has a longitudinal width, X1, between opposed lateral sides connecting the opposed inward and outward facing ends. Each successive strip 516 has the respective inward and outward ends oriented oppositely to the inward and outward ends of the preceding and following strips 516.

A first one of the resistor strips 516 is disposed between the first and second adjacent lateral conductor segments 510. Each side of the strip 516 is spaced away from the respective segments 510 by the gap distance, Dg. The inward facing end of the strip 516 is directed toward the corresponding first longitudinal segment 508 disposed between the first and second adjacent lateral segments 510. The outward facing end of the first resistor strip 516 is connected to the inner edge of the ground conductor 504 opposite to the connecting first longitudinal segment 508. Each resistor strip 516 forms a lossy ground conductor along either side, adjacent to a first portion 512 of each of the adjacent lateral segments 510. In a conventional slow wave transmission line structure, the resistor strip 516 would be a high conductivity conductor.

A second one of the resistor strips 516 is disposed between the second and third adjacent lateral conductor segments 510. Each side of the second strip 516 is spaced away from the respective segments 510 by the gap distance, Dg. The inward facing end of the second strip 516 is directed toward the corresponding second longitudinal segment 508 connected between the opposite ends of the second and third adjacent lateral segments 510. The outward facing end of the first resistor strip 516 is connected to the inner edge of the ground conductor 502 opposite to the connecting second longitudinal segment 508. Each resistor strip 516 forms a lossy ground conductor along either side, adjacent to a corresponding first portion 512 of each of the second and third adjacent lateral segments 510.

Each succeeding one of the lateral resistor strips 516 is similarly disposed between and spaced from the corresponding preceding and succeeding adjacent lateral strips 510. Each side of each succeeding resistor strip 516 is spaced away from the respective preceding and succeeding lateral segments 510 by the gap distance, Dg. The inward facing end of each succeeding strip 516 is directed toward the corresponding longitudinal segment 508 connected between the opposite ends of the corresponding preceding and succeeding adjacent lateral segments 510. The outward facing end of each succeeding resistor strip 516 is connected to the inner edge of the ground conductor opposite to the corresponding connecting longitudinal segment 508. Each succeeding resistor strip 516 forms a lossy ground conductor along either side, adjacent to a corresponding first portion 512 of each of the preceding and succeeding adjacent lateral segments 510.

A second plurality of coplanar resistor strips 518 is defined on the substrate 404. Each resistor 518 has a periphery having a first U-shaped portion 518b coincident with the inner edge of each respective longitudinal strip 508 and a portion 514 of each of the respective connected adjacent lateral strips 510. The balance of the periphery 518a forms a longitudinal edge facing the inward facing end of the respective resistor strip 516. Each resistor strip 518 and laterally adjacent resistor strip 516 are accordingly referred to as being disposed on laterally adjacent lengths of conductor 510 and respective ground conductor 502 or 504. The longitudinal edge 518a is spaced from the respective inward facing end of 516 by the gap distance, Dg. Each resistor 518 defines a lateral length, Y2, between the inner edge of the respective longitudinal conductor strip 508 and the respective peripheral edge 518a along the portions 514 of the adjacent lateral strips 510.

The overall lateral size of the bias structure 500 is:

2*Wg+Y1+2*Dg+Y2+Ws1

TABLE II

| Lrb | 20 mils |
|---|---|
| Wg | 4 mil |
| Dg | 1 mil |

TABLE II-continued

| Ws1 | 1 mil |
|---|---|
| X1 | 1 mil |
| Y1 | 11 mil |
| X2 | 3 mil |
| Y2 | 8 mil |

The overall longitudinal size of the bias structure 500 is Lrb, not including connections to the opposed ends 506a and 506b.

In alternative embodiments of the structure 500, the widths of the segments 508 and 510, and the lengths of segments 508 and 510 may be unequal. The position of the segments 508 and 510 between the ground conductors 502 and 504 may also be nonuniform. For example, the segments position, length and width may vary as a log periodic function along the length of the conductors 506, 502 and 504. It is also contemplated that the topology of the coplanar structure 500 may be curvilinear, e.g., a spiral or semicircle or the like along the length of the conductors 506, 502 and 504.

FIG. 16 depicts an equivalent circuit schematic of the meandering lossy bias structure 500. The inductive component of ground connections 502, 504 are represented as lumped inductors L2. The resistive film strips 516 are represented as resistors Rf. Capacitors, C, represent the capacitive coupling between sides of the resistive film strips 516 and the adjacent lateral portions 512 of lateral segments 510. Resistor Rs represents the resistive component of the resistive film strip 518 coupled to the inductive component, L1, contributed by the series connection of the longitudinal segment 508 and adjacent portions 514 of lateral segments 510, and in series with the inductive component, L3, contributed by the portions of lateral segments 510 located between adjacent portions 514.

Both resistors are important for optimum absorption. If resistive film strip 518 is too long, the resistive film strip 516 will be too short to act as lossy grounds for the strip transmission line segments 510. If resistive film strip 518 is short, there will be insufficient loss coupled to the transmission line portions 514.

The power absorbing effectiveness of the structure 500 can be characterized by measuring the percent power absorbed, Pa, for a given unit length, Lrb. Considering connection 506b as an input and 506a as an output, Pa is defined as:

Pa=(100−Pr−Pt)% where Pr is the percent power reflected at the input 506b, and Pt is the percent power transmitted at the output, 506a, considering the incident power, Pi, at the input 506b, as one hundred percent.

A prototype of power absorbing structure 500 on a BeO substrate with resistors 516, 518 of 50 ohm per square was simulated at 30 GHz. 68.5% of the incident power was absorbed. The relevant dimensions of the prototype are listed in Table II.

The percent power absorbed for the bias structure 350 (discussed previously with reference to FIG. 13) having comparable dimensions, was simulated to be about 50.8%. It is apparent that the meandering bias structure 500 is a more area efficient power absorbing structure.

Selection of the dimensions for the structure 500 are constrained by several factors: 1) the area available, e.g., the maximum height and width allowable; 2) the photolithographic process limitations (e.g. minimum line width and spacing for the given process). For a given process, the minimum line width and gap spacing determines W, Dg and Ws1. X2 is then constrained to be X1+2*Dg. With a given structure height, the other parameters Wg, Y2 and Y1 must be selected. Given a practical minimum limit for Wg of about 3 mils, the only design parameter to be selected is to apportion the lengths of Y2 and Y1. Simulations using a commercial electromagnetic simulator software package, such as "IE3D", available from Zeland Software, Fremont, Calif., "EM", from Sonnet Software, New York, N.Y., or others, may be used to optimize this apportionment.

While the foregoing detailed description has described several embodiments in accordance with this invention, it is to be understood that the above description is illustrative only and not limiting of the disclosed invention. It will be appreciated that it would be possible to modify the size, shape, appearance and methods of manufacture of various elements of the invention or to include or exclude various elements within the scope and spirit of this invention. Different spurious mode suppression structures are made possible by changing the patterns of the adjacent coplanar resistive films and/or the conductors. The conductor and resistor patterns of this invention may be disposed in non-uniform planar topologies such as spiral, circular, log periodic, exponential, meandering, serpentine, semi-circular arc segments and the like. Thus the invention is to be limited only by the claims as set forth below.

What is claimed is:

1. A coplanar circuit structure for suppressing spurious modes comprising:
   an insulating substrate having a planar surface;
   a coplanar transmission line including at least first and second spaced-apart coplanar strip conductors mounted on the substrate surface, the first and second conductors being spaced apart by a first gap;
   a first resistive film disposed on the substrate surface and extending coplanar with, adjacent to and along a length of the first conductor; and
   a second resistive film disposed on the substrate surface and extending coplanar with, adjacent to and along a length of the second conductor;
   the first and second resistive films being coupled to the first and second conductors for attenuating spurious modes.

2. A coplanar circuit structure according to claim 1 wherein the first conductor has a first signal conducting edge, the second conductor has a second signal conducting edge spaced away from the first conducting edge by the first gap, the first and second conductors extend transversely in opposite directions away from the first gap, the first conductor defines a third conductor edge spaced away from the first conductor edge, the second conductor defines a fourth conductor edge spaced away from the second conductor edge, the first resistive film defines a first resistive edge coupled to the third conductor edge, and the second resistive film defines a second resistive edge coupled to the fourth conductor edge.

3. A coplanar circuit structure as set forth in claim 2 further comprising:
   a third coplanar conductor separated from and spaced between the first and second coplanar conductors thereby forming a coplanar waveguide transmission line.

4. A coplanar circuit structure as set forth in claim 2 wherein the first and second conductors and the first and second resistive films have a common length, Lr, between opposed ends;

the first resistive film has a third resistive edge spaced away from the first resistive edge at least a distance Wr; and
the second resistive film has a fourth resistive edge spaced away from the second resistive edge at least a distance Wr', the length, Lr, and the widths, Wr and Wr' being selected such that spurious modes are attenuated.

5. A coplanar circuit structure as set forth in claim 2 wherein the coupling between the first resistive edge and the third conductor edge is electromagnetic coupling.

6. A coplanar circuit structure as set forth in claim 2 wherein the coupling between the first resistive edge and the third conductor edge is conductive coupling.

7. A coplanar circuit structure as set forth in claim 2 wherein the first resistive edge and the third conductor edge are spaced apart by a second gap having a predetermined width.

8. A coplanar circuit structure as set forth in claim 2 further comprising a third resistive edge of the first resistive film being spaced away from the first resistive edge by a predetermined width.

9. A coplanar circuit structure as set forth in claim 8 further comprising a fourth resistive edge of the second resistive film being spaced away from the second resistive edge by the same predetermined width.

10. A coplanar circuit structure, as set forth in claim 8 in which the spacing of the third resistive edge from the first resistive edge is such that spurious signals selected from the group of waveguide and cavity mode signals are attenuated by the first resistive film.

11. A coplanar circuit structure, as set forth in claim 8 in which the spacing of the third resistive edge from the first resistive edge is such that spurious slab mode signals in the substrate are attenuated.

12. A coplanar circuit structure as set forth in claim 8 wherein the third resistive edge of the first resistive film is spaced away from the first resistive edge about $\lambda_x/4$ or greater, where $\lambda_x$ is the wavelength of the spurious mode.

13. A coplanar circuit structure as set forth in claim 8 wherein the third resistive edge of the first resistive film is spaced away from the first resistive edge a distance on the order of magnitude of about 1.125 mm or 0.045 inches or greater.

14. A coplanar circuit structure, as set forth in claim 8 in which the spacing of the third resistive edge from the first resistive edge is such that spurious microstrip mode signals having current components tending to flow conductively in the first resistive film will be attenuated.

15. A coplanar circuit structure, as set forth in claim 8 in which the conductive coupling between the first resistive edge of the first resistive film to the third conductor edge of the first conductor is by contiguous conductive contact.

16. A coplanar circuit structure as set forth in claim 2 further comprising:
   a flip-chip active device having at least two terminals mounted on the substrate surface;
   at least one of the first and second conductors being connected to at least one terminal of the flip-chip device.

17. A coplanar circuit structure as set forth in claim 16, further comprising:
   a third coplanar conductor disposed on the surface, the third conductor coupled to the coplanar resistive films;
   a second flip-chip active device connection mounted to the third conductor;
   one of the resistive films defining a decoupling slot having a first end and a second end and a length therebetween, the slot interposed between the first one of the device connections and the second flip-chip active device connection, the first end disposed laterally on one side of the first and second connections, the second end disposed laterally on the other side of the first and second connections, the slot length being sufficient to essentially decouple the first and the second connections from undesired signals therebetween.

18. A coplanar circuit structure for suppressing spurious modes as set forth in claim 16 further comprising:
a third coplanar conductor separated from and spaced between the first and second coplanar conductors thereby forming a coplanar waveguide transmission line.

19. A coplanar circuit structure as set forth in claim 2 in which the first resistive film has an average sheet resistivity matched to the characteristic impedance of the spurious mode.

20. A coplanar circuit structure as set forth in claim 2 in which the first resistive film has an average sheet resistivity of about 50 ohms/square.

21. A coplanar circuit structure as set forth in claim 2 in which the first resistive film has an average sheet resistivity between about 10 and 1000 ohms/square.

22. A coplanar circuit structure as set forth in claim 2, in which the spacing of the first conductor edge and the third conductor edge are sufficiently large such that coplanar mode signals of wavelength $\lambda_s$ can propagate along the first conductor edge and the second conductor edge with essentially zero current component along the third conductor edge.

23. A coplanar circuit structure as set forth in claim 2 in which the first resistive film is in the form of a mesh having a predetermined ratio of resistive area to insulating area.

24. A coplanar circuit structure as set forth in claim 2 in which the first resistive film is in the form of a mesh having a resistive area to insulating area ratio such that the average sheet resistance matches the characteristic impedance of the spurious mode.

25. A coplanar circuit structure as set forth in claim 2 in which the first resistive film is in the form of a mesh having a generally rectangular aperture.

26. A coplanar circuit structure as set forth in claim 2 in which the first resistive film is in the form of a mesh having an average sheet resistance which matches the characteristic impedance of the spurious mode.

27. A coplanar circuit structure as set forth in claim 2 in which the width of the first resistive film between the first resistive edge and the third resistive edge is more than about $\frac{1}{4}\lambda_x$, where $\lambda_x$ is the wavelength of the spurious signal to be suppressed.

28. A coplanar circuit structure as set forth in claim 2 in which the first resistive edge of the first resistive film and the third conductor edge of the first conductor are spaced apart and electromagnetically coupled across a second insulating gap.

29. A coplanar circuit structure as set forth in claim 2 having a first gap width of about 0.05 mm or 2 mils.

30. A coplanar circuit structure as set forth in claim 2 wherein the third conductor edge is spaced away from the first conductor edge by a distance on the order of magnitude of about 0.125 mm or 0.005 inches.

31. A coplanar circuit structure as set forth in claim 2 wherein the second conductor edge is spaced away from the first conductor edge by a distance on the order of magnitude of about 0.025 mm or 0.001 inches.

32. A coplanar circuit structure as set forth in claim 1 wherein the first resistive film is spaced apart from the first conductor by a second gap having a width that is not greater than a distance on the order of magnitude of about $\lambda_x/90$, where $\lambda_x$ is the wavelength of the spurious mode.

33. A coplanar circuit structure as set forth in claim 1 wherein the first resistive film is spaced apart from the first conductor by a second gap having a width that is not greater than a distance on the order of magnitude of about 0.05 mm or 0.002 inches.

34. A coplanar circuit structure as set forth in claim 1 wherein the first and second resistive films are configured as respective first and second fingers extending respectively from the first and second conductors toward the second and first conductors.

35. A coplanar circuit structure as set forth in claim 34 wherein the first and second fingers and the first and second conductors are configured to form a continuous meandering gap.

36. A coplanar circuit structure as set forth in claim 35 wherein the first conductor includes a section extending laterally away from the second conductor in a U-shaped loop, with the first and second fingers positioned in the loop.

37. A coplanar circuit structure as set forth in claim 36 wherein the first finger is contiguous with the first conductor on three sides at the base of the loop.

38. A coplanar circuit structure as set forth in claim 37 wherein the second finger extends from the second conductor into the loop and is spaced from the first conductor and the first finger.

39. A coplanar circuit structure as set forth in claim 38 wherein the first conductor has a meandering shape forming a plurality of the U-shaped loops, and there are a corresponding plurality of the first and second fingers disposed in the loops, the conductors and fingers defining a first meandering gap.

40. A coplanar circuit structure as set forth in claim 39 further comprising a third conductor extending parallel with the second conductor, the first conductor being disposed between the second and third conductors and forming a plurality of U-shaped loops open alternately toward the second and third conductors, a plurality of spaced-apart third and fourth resistive fingers, with each third finger being contiguous with the first conductor on three sides at the base of each loop open toward the third conductor and each fourth finger extends from the third conductor into each loop open toward the third conductor and is spaced from the first conductor and the associated third finger, the first and third conductors and the third and fourth fingers defining a second meandering gap.

41. A coplanar circuit structure as set forth in claim 40 further comprising:
a flip-chip active device having an input signal terminal and an output signal terminal and at least one ground terminal;
the second and third conductors forming respective first and second coplanar ground conductor strips longitudinally disposed and spaced apart from each other on the substrate, each ground strip having respective adjacent opposed proximal and distal ends and opposed inward facing edges, the proximal end of at least one ground strip having a connection to the at least one device ground terminal;
the first conductor forming a coplanar signal conductor strip defined on the substrate disposed between the inward facing edges of the first and second ground conductors, the signal strip extending between a proximal end and a distal end, the proximal end located near the proximal ends of the two ground conductors and having a coplanar connection to one of the device signal terminals, and the distal end located near the distal ends of the ground conductors, the signal strip being comprised of a succession of continuously connected coplanar conductive segments forming the U-shaped loops, including a plurality of longitudinal conductive segments, and a plurality of lateral conductive segments, each segment being of equal width between respective opposed sides;

the plurality of longitudinal segments being oriented parallel to the ground conductors, the longitudinal segments being each of equal first length between respective proximal and distal ends, every other longitudinal segment having one of the opposed sides facing outward to, and spaced away from, the inward facing edge of the opposite ground strip by a width, Dg;

the plurality of lateral segments being of equal second length between respective laterally opposed first and second ends, each lateral segment being positioned orthogonally between the respective inner edges of the ground conductors, the first ends and opposed ends of the lateral segments being spaced away from the respective inward facing edges of the opposed ground conductors by the width, Dg;

a first one of the lateral segments being located proximally to the proximal end of the central signal conductor strip;

a second one of the lateral segments being displaced distally from the first one of the lateral segments by the first length of the longitudinal segments, each successive lateral segment being displaced distally from the preceding lateral segment by the first length of the longitudinal segments;

a first one of the longitudinal segments being disposed between the first and second lateral segment, the first one of the longitudinal segments having the respective proximal end joined with the adjacent first end of the first lateral segment and the distal end joined with the adjacent first end of the second lateral segment;

a second one of the longitudinal segments having the proximal end joined with the opposed end of the second lateral segment and the distal end joined with the adjacent opposed end of the third lateral segment;

each succeeding longitudinal segment having the respective proximal end joined with the respective opposite adjacent end of the preceding lateral segment, the distal end of the succeeding longitudinal segment being joined with the opposite adjacent end of the succeeding lateral segment;

an outer edge of each longitudinal segment being spaced away from the inward facing edge of the respective ground strip by the gap width, Dg;

the second and fourth fingers forming a plurality of coplanar lateral resistive film strips being defined on the substrate, disposed orthogonally to the ground conductors, each one of the resistive film strips having a lateral length, between a respective inward facing end and a respective opposed outward facing end, each lateral resistive film strip having a longitudinal width between opposed lateral sides connecting the opposed inward and outward facing ends, each one of the coplanar resistive film strips being connected to the inner edge of one of the ground conductor strips, each succeeding one of the coplanar resistive film strips being connected to the opposite ground conductor strip of the preceding one of the coplanar resistive film strips;

each one of the coplanar lateral resistive film strips being disposed between a respective two of the adjacent lateral conductor segments, each lateral side of the each one of the resistive film strips being spaced away from the respective lateral segments by the gap width, Dg, the inward facing end of the each one of the coplanar resistive film strips being directed toward the opposite ground conductor strip, each one of the coplanar resistive film strips forming a lossy ground conductor along either side, adjacent to a respective first portion of each of the respective adjacent lateral segments;

the first and third fingers forming a plurality of coplanar resistive film areas being defined on the substrate, each area disposed between a respective pair of lateral conductor segments, each area having a longitudinal resistive film edge facing the inward facing end of the respective lateral resistive film strip, the longitudinal resistive film edge being spaced from the respective inward facing end by the gap distance, Dg, each resistive film area having a periphery coincident with the inner edge of each respective longitudinal strip and a respective second portion of each of the respective adjacent lateral strips, the resistive film area having a third lateral length between the inner edge of the respective longitudinal conductor strip and the longitudinal resistive film edge.

42. A coplanar circuit structure as set forth in claim 40, in which the first, second, third and fourth fingers are of the same resistivity.

43. A coplanar circuit structure as set forth in claim 42, in which the resistivity is between about 10 and 1000 ohms/square.

44. A coplanar circuit structure as set forth in claim 42, in which the resistivity is about 50 ohm/square.

45. A coplanar circuit structure as set forth in claim 34 wherein the first and second fingers extend along longitudinally displaced lengths of the first and second conductors.

46. A coplanar circuit structure as set forth in claim 45 wherein the first and second fingers and the first and second conductors are configured to form a continuous meandering gap.

47. A coplanar circuit structure as set forth in claim 46 wherein the fingers have proximal ends adjacent to the respective conductors and distal ends that extend adjacent to each other.

48. A coplanar circuit structure as set forth in claim 46 wherein there are a plurality of longitudinally spaced first and second fingers, the first fingers being interdigitated with the second fingers.

49. A coplanar circuit structure as set forth in claim 48 further comprising a third conductor, the first conductor extending parallel to and between the second and third conductors, a plurality of spaced-apart third fingers extending from the first conductor toward the third conductor and a plurality of spaced-apart fourth fingers extending from the third conductor toward the first conductor, the third and fourth fingers being interdigitated.

50. A coplanar circuit structure as set forth in claim 49 wherein the first and third fingers are in alignment along the first conductor.

51. A coplanar circuit structure as set forth in claim 50 wherein the first and third fingers are formed of an integral resistive film overlaying the first conductor.

52. A coplanar circuit structure
as set forth in claim 51 wherein the first conductor is a first conductor strip extending longitudinally between a first end and a second end;

and the second and third conductors are a pair of coplanar conductive ground strips being positioned on the substrate oppositely and distally adjacent to and electrically coupled with the respective distal ends of the respective plurality of interdigitated resistive fingers, whereby the circuit structure functions as a lossy bias circuit structure.

53. A coplanar circuit structure as set forth in claim 52, in which adjacent resistive fingers are spaced apart by about 0.025 mm or 1 mil.

54. A coplanar circuit structure as set forth in claim 52, in which each first and third resistive finger has a length of about 0.2 mm or 8 mils and a width of about 0.25 mm or 1 mil.

55. A coplanar circuit structure as set forth in claim 52, in which each second and fourth resistive finger has a length of about 0.18 mm or 7 mils and width of about 0.025 mm or 1 mil.

56. A coplanar circuit structure as set forth in claim 52, in which the first conductor strip extends longitudinally about 6.6 mm or 260 mils.

57. A coplanar circuit structure as set forth in claim 52, further comprising:
   an active device having an input terminal, an output terminal and at least one ground terminal mounted to the substrate surface;
   the second end of the first conductor strip being electrically connected to at least one terminal of the active device;
   one end of at least one of the ground strips being electrically connected to a ground terminal of the active device.

58. A coplanar circuit structure as set forth in claim 57, wherein the electrical connections are coplanar connections.

59. A coplanar circuit structure as set forth in claim 57, in which the active device is a flip-chip active device.

60. A coplanar circuit structure as set forth in claim 1 wherein the first and second resistive films extend along longitudinally displaced lengths of the first and second conductors.

61. A coplanar circuit structure as set forth in claim 1 wherein the first and second resistive films and the first and second conductors are configured to form a continuous meandering gap.

62. A coplanar circuit structure as set forth in claim 1 wherein the first resistive film is disposed in the first gap.

63. A coplanar circuit structure as set forth in claim 62 wherein the second resistive film is also disposed in the first gap.

64. A coplanar circuit structure as set forth in claim 63 wherein the first and second resistive films extend along laterally adjacent lengths of the first and second conductors.

65. A coplanar circuit structure as set forth in claim 64 wherein the first and second resistive films are spaced apart by a second gap.

66. A coplanar circuit structure as set forth in claim 65 wherein the first conductor has opposed sides and opposed ends, the opposed ends each having respective connections,
   and further comprising a third conductor and third and fourth resistive films, the first and third resistive films contiguously adjoining the respective opposed sides of the first conductor
   and the second resistive film contiguously adjoining the second conductor and the fourth resistive film adjacent to and spaced apart from the third resistive film by a third gap, the fourth resistive film contiguously adjoining the third conductor,
   whereby the first conductor may be connected to provide a low DC resistance for efficient transfer of DC or low frequency power from an external supply to an active device while absorbing or attenuating the transmission of high frequency signals between the ends of the first conductor.

67. A coplanar circuit structure as set forth in claim 66, having at least one connection configured for connection to a flip-chip active device, the other connection being configured for connecting to an external power supply.

68. A coplanar circuit structure as set forth in claim 66, wherein the length of the first conductor and the widths of the first, second, third and fourth resistive films and the second and third gaps are selected to provide the desired attenuation of mm-wave signals traveling along the transmission line.

69. A coplanar circuit structure for suppressing spurious modes comprising:
   an insulating substrate having a planar surface;
   a transmission line including at least first and second spaced-apart coplanar conductors mounted on the substrate surface, the first and second conductors being spaced apart by a first gap; and
   a resistive film disposed on the substrate surface and extending coplanar with, adjacent to and along a length of the first conductor in the first gap;
   the resistive film being coupled to the first conductor for attenuating spurious modes.

* * * * *